(12) United States Patent
Said et al.

(10) Patent No.: US 11,968,826 B2
(45) Date of Patent: Apr. 23, 2024

(54) THREE-DIMENSIONAL MEMORY DEVICE WITH METAL-BARRIER-METAL WORD LINES AND METHODS OF MAKING THE SAME

(71) Applicant: SANDISK TECHNOLOGIES LLC, Addison, TX (US)

(72) Inventors: Ramy Nashed Bassely Said, San Jose, CA (US); Raghuveer S. Makala, Campbell, CA (US); Senaka Kanakamedala, San Jose, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 142 days.

(21) Appl. No.: 17/244,186

(22) Filed: Apr. 29, 2021

(65) Prior Publication Data

US 2022/0352193 A1    Nov. 3, 2022

(51) Int. Cl.
  *H10B 41/27*  (2023.01)
  *H10B 41/10*  (2023.01)
  (Continued)

(52) U.S. Cl.
  CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
  None
  See application file for complete search history.

(56) References Cited

U.S. PATENT DOCUMENTS 9,230,976 B2  1/2016 Alsmeier
9,230,983 B1  1/2016 Sharangpani et al.
(Continued)

FOREIGN PATENT DOCUMENTS

WO    WO 2021/118627 A1    6/2021

OTHER PUBLICATIONS

Endoh et al., "Novel Ultra High Density Memory with a Stacked-Surrounding Gate Transistor (S-SGT) Structured Cell," IEDM Proc. (2001) pp. 33-36.
(Continued)

*Primary Examiner* — Nilufa Rahim
(74) *Attorney, Agent, or Firm* — THE MARBURY LAW GROUP PLLC

(57) ABSTRACT

A three-dimensional memory device includes an alternating stack of insulating layers and electrically conductive layers, memory openings extending through the alternating stack, and memory opening fill structures located in the memory openings and containing a respective vertical semiconductor channel and a respective memory film. Each of the electrically conductive layers includes a tubular metallic liner in contact with a respective outer sidewall segment of a respective one of the memory opening fill structures, an electrically conductive barrier layer contacting the respective tubular metallic liner and two of the insulating layers, and a metallic fill material layer contacting the electrically conductive barrier layer, and not contacting the tubular metallic liner or any of the insulating layers. The memory opening fill structures are formed after performing a halogen outgassing anneal through the memory openings to reduce or eliminate the halogen outgassing damage in the layers of the memory film.

6 Claims, 33 Drawing Sheets

(51) Int. Cl.
*H10B 41/35* (2023.01)
*H10B 43/10* (2023.01)
*H10B 43/27* (2023.01)
*H10B 43/35* (2023.01)

(56) References Cited

U.S. PATENT DOCUMENTS

| | | | |
|---|---|---|---|
| 9,397,046 | B1 | 7/2016 | Sharangpani et al. |
| 9,496,419 | B2 | 11/2016 | Sharangpani et al. |
| 9,570,455 | B2 | 2/2017 | Sharangpani et al. |
| 9,646,975 | B2 | 5/2017 | Peri et al. |
| 9,698,223 | B2 | 7/2017 | Sharangpani et al. |
| 9,748,174 | B1 | 8/2017 | Amano |
| 9,780,182 | B2 | 10/2017 | Peri et al. |
| 9,793,139 | B2 | 10/2017 | Sharangpani et al. |
| 9,799,671 | B2 | 10/2017 | Pachamuthu et al. |
| 9,842,907 | B2 | 12/2017 | Makala et al. |
| 9,984,963 | B2 | 5/2018 | Peri et al. |
| 10,083,983 | B2 | 9/2018 | Shigemura et al. |
| 10,229,931 | B1 | 3/2019 | Hinoue et al. |
| 10,283,513 | B1 | 5/2019 | Zhou et al. |
| 10,290,652 | B1 | 5/2019 | Sharangpani et al. |
| 10,304,852 | B1 | 5/2019 | Cui et al. |
| 10,361,213 | B2 | 7/2019 | Sharangpani et al. |
| 10,381,362 | B1 | 8/2019 | Cui et al. |
| 10,510,738 | B2 | 12/2019 | Kim et al. |
| 10,529,620 | B2 | 1/2020 | Sharangpani et al. |
| 10,608,010 | B2 | 3/2020 | Terasawa et al. |
| 10,615,123 | B2 | 4/2020 | Hinoue et al. |
| 10,707,233 | B1* | 7/2020 | Cui .................. H01L 21/02208 |
| 10,741,572 | B2 | 8/2020 | Sharangpani et al. |
| 10,818,542 | B2 | 10/2020 | Cui et al. |
| 2010/0163968 | A1* | 7/2010 | Kim ....................... H10B 43/27 257/E21.423 |
| 2011/0189846 | A1* | 8/2011 | Lee ..................... H01L 29/7881 257/E21.21 |
| 2014/0070300 | A1* | 3/2014 | Jang .................. H01L 29/66833 257/324 |
| 2015/0035035 | A1* | 2/2015 | Matsuda ................ H10B 43/35 257/314 |
| 2015/0371997 | A1* | 12/2015 | Higuchi ................ H10B 41/27 257/315 |
| 2016/0149002 | A1 | 5/2016 | Sharangpani et al. |
| 2016/0172370 | A1* | 6/2016 | Makala .................. H10B 43/27 438/269 |
| 2016/0225866 | A1 | 8/2016 | Peri et al. |
| 2016/0300848 | A1 | 10/2016 | Pachamuthu et al. |
| 2016/0351497 | A1 | 12/2016 | Peri et al. |
| 2017/0084618 | A1 | 3/2017 | Peri et al. |
| 2017/0098656 | A1* | 4/2017 | Son ....................... H10B 43/27 |
| 2017/0125538 | A1 | 5/2017 | Sharangpani et al. |
| 2017/0352669 | A1 | 12/2017 | Sharangpani et al. |
| 2017/0373079 | A1 | 12/2017 | Sharangpani et al. |
| 2018/0090373 | A1* | 3/2018 | Sharangpani .......... H10B 41/35 |
| 2018/0138194 | A1 | 5/2018 | Shigemura et al. |
| 2019/0139973 | A1 | 5/2019 | Zhou et al. |
| 2019/0221557 | A1 | 7/2019 | Kim et al. |
| 2019/0280001 | A1 | 9/2019 | Terasawa et al. |
| 2019/0287916 | A1 | 9/2019 | Sharangpani et al. |
| 2019/0287982 | A1 | 9/2019 | Hinoue et al. |
| 2020/0119030 | A1* | 4/2020 | Dasgupta .......... H01L 21/02458 |
| 2021/0082955 | A1 | 3/2021 | Rajashekhar et al. |
| 2021/0265385 | A1* | 8/2021 | Rajashekhar .......... H10B 43/27 |
| 2022/0130862 | A1* | 4/2022 | Lue ....................... H10B 51/20 |
| 2022/0344362 | A1* | 10/2022 | Cui ....................... H10B 41/27 |

OTHER PUBLICATIONS

Groenen, P. A. C., "The reaction mechanism of W-CVD on Si", Technische Universiteit Eindhoven, (1993), https:/doi.org/10.6100/IR391180.

U.S. Appl. No. 16/568,668, filed Sep. 12, 2019, SanDisk Technologies LLC.

U.S. Appl. No. 16/710,481, filed Dec. 11, 2019, SanDisk Technologies LLC.

U.S. Appl. No. 16/710,572, filed Dec. 11, 2019, SanDisk Technologies LLC.

U.S. Appl. No. 17/134,997, filed Dec. 28, 2020, SanDisk Technologies LLC.

ISR—Notification of Transmittal of The International Search Report and Written Opinion of the International Searching Authority for International Patent Application No. PCT/US2021/065564, dated Apr. 10, 2022, 15 pages.

* cited by examiner

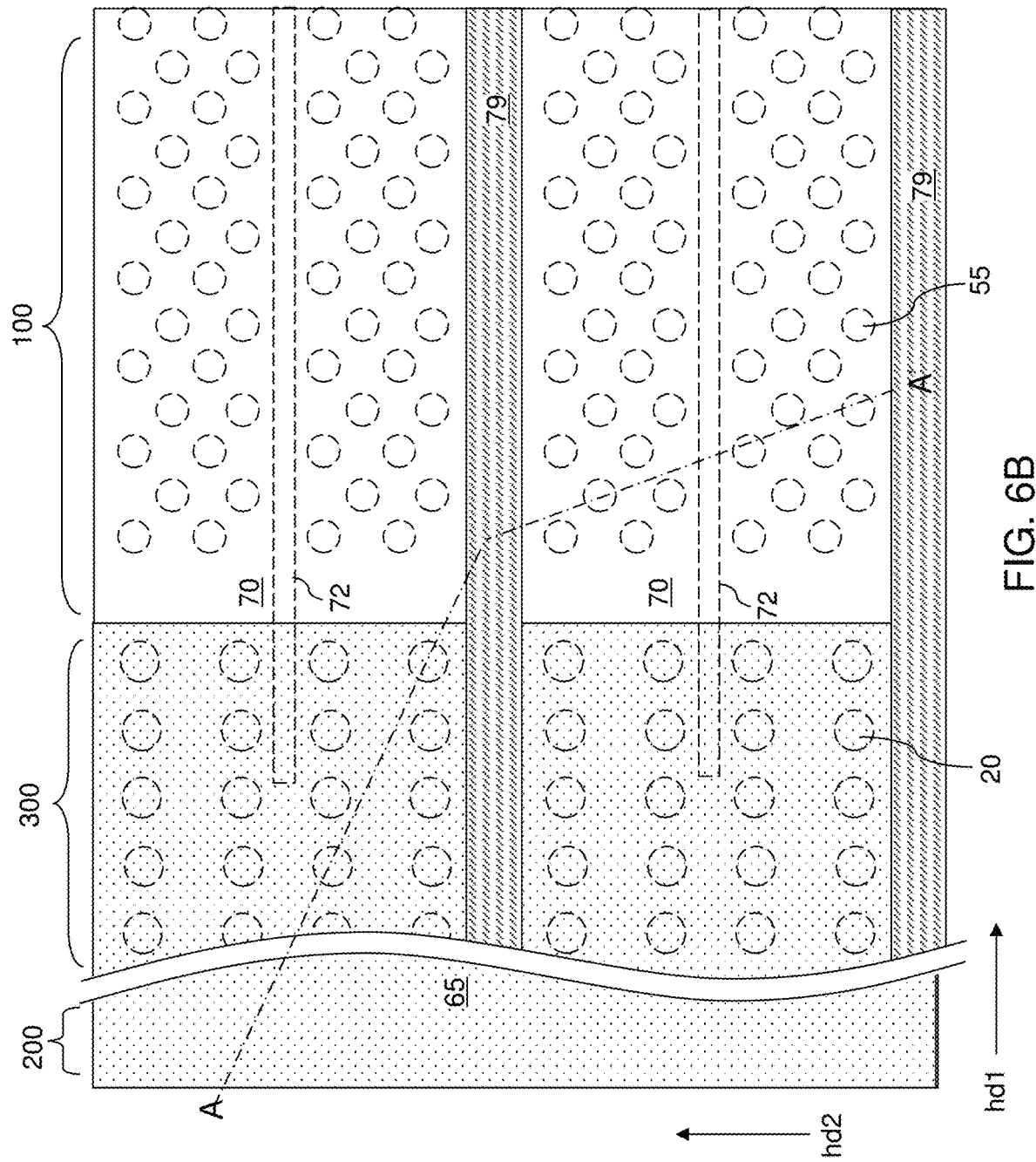

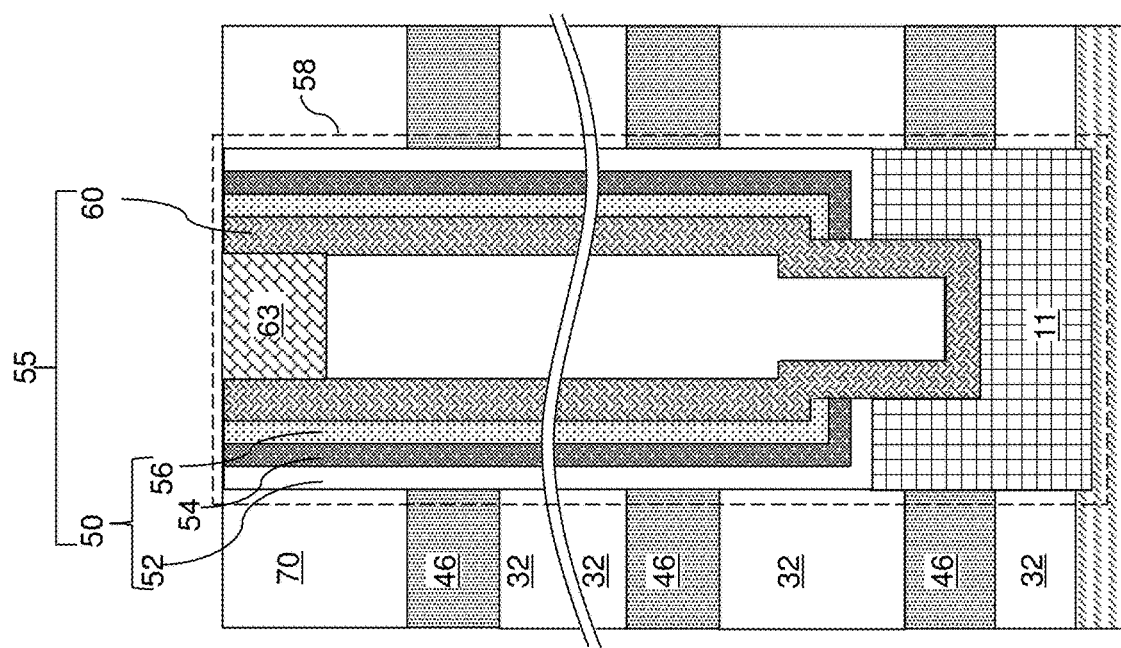

THREE-DIMENSIONAL MEMORY DEVICE WITH METAL-BARRIER-METAL WORD LINES AND METHODS OF MAKING THE SAME

FIELD

The present disclosure relates generally to the field of semiconductor devices, and particularly to a three-dimensional memory device containing metal-barrier-metal word lines and methods of making the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to one embodiment, a three-dimensional memory device includes an alternating stack of insulating layers and electrically conductive layers, memory openings extending through the alternating stack, and memory opening fill structures located in the memory openings and containing a respective vertical semiconductor channel and a respective memory film. Each of the electrically conductive layers includes a tubular metallic liner in contact with a respective outer sidewall segment of a respective one of the memory opening fill structures, an electrically conductive barrier layer contacting the respective tubular metallic liner and two of the insulating layers, and a metallic fill material layer contacting the electrically conductive barrier layer, and not contacting the tubular metallic liner or any of the insulating layers.

According to another embodiment, a method of forming a three-dimensional memory device comprises forming an alternating stack of insulating layers and sacrificial material layers over a substrate, forming memory openings through the alternating stack, and forming sacrificial memory opening fill structures in the memory openings, wherein each of the sacrificial memory opening fill structures comprises a respective nucleation material liner. The method also includes forming backside recesses by removing the sacrificial material layers selective to the insulating layers, forming tubular metallic liners by reacting a metal-containing precursor gas with surface portions of the nucleation material liners that are physically exposed to the backside recesses, forming a metallic fill material layer in the backside recesses, removing the sacrificial memory opening fill structures from the memory openings, outgassing a halogen from the metallic fill material layer through the memory opening fill structures, and forming memory opening fill structures in the memory openings after the step of outgassing. Each of the memory opening fill structures comprises a respective memory film and a respective vertical semiconductor channel.

BRIEF DESCRIPTION OF THE DRAWINGS

FIG. 6B is a top-down view of the first exemplary structure of FIG. 6A. The vertical plane A-A' is the plane of the cross-section for FIG. 6A.

FIG. 13B is close-up schematic vertical cross-sectional view of the memory opening fill structure of FIG. 13A.

DETAILED DESCRIPTION

Figure 1:
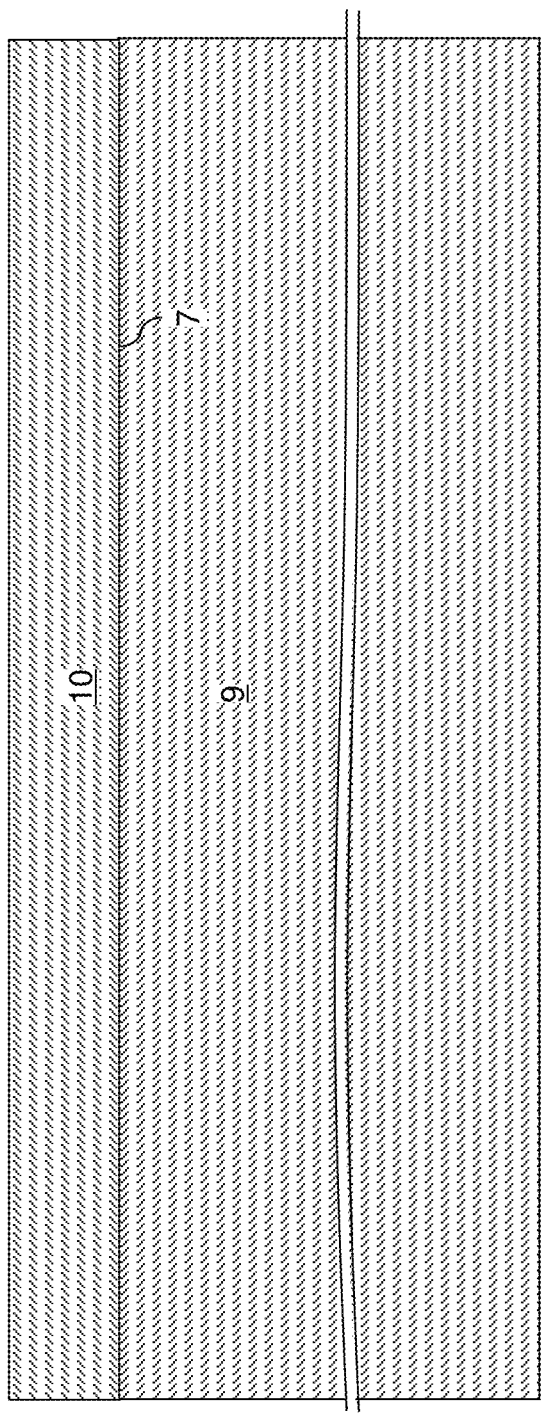
FIG. 1 is a schematic vertical cross-sectional view of a first exemplary structure including a substrate layer and an optional semiconductor material layer according to an embodiment of the present disclosure.

As discussed above, the embodiments of the present disclosure are directed to three-dimensional memory devices containing metal-barrier-metal word lines, and using seed layers to form such word lines. If the word lines include tungsten deposited using a fluorine containing precursor, then the tungsten containing word lines may be formed prior to forming the memory film and the vertical semiconductor channel to permit outgassing of fluorine through the memory openings. The embodiments of the present disclosure can be used to form various structures including a multilevel memory structure, non-limiting examples of which include semiconductor devices, such as three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate layer 9 and an optional semiconductor material layer 10. The substrate layer 9 maybe a semiconductor wafer (such as a silicon wafer) or a silicon-on-insulator substrate. The substrate layer 9 can include a major surface 7, which can be a planar surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm.

An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
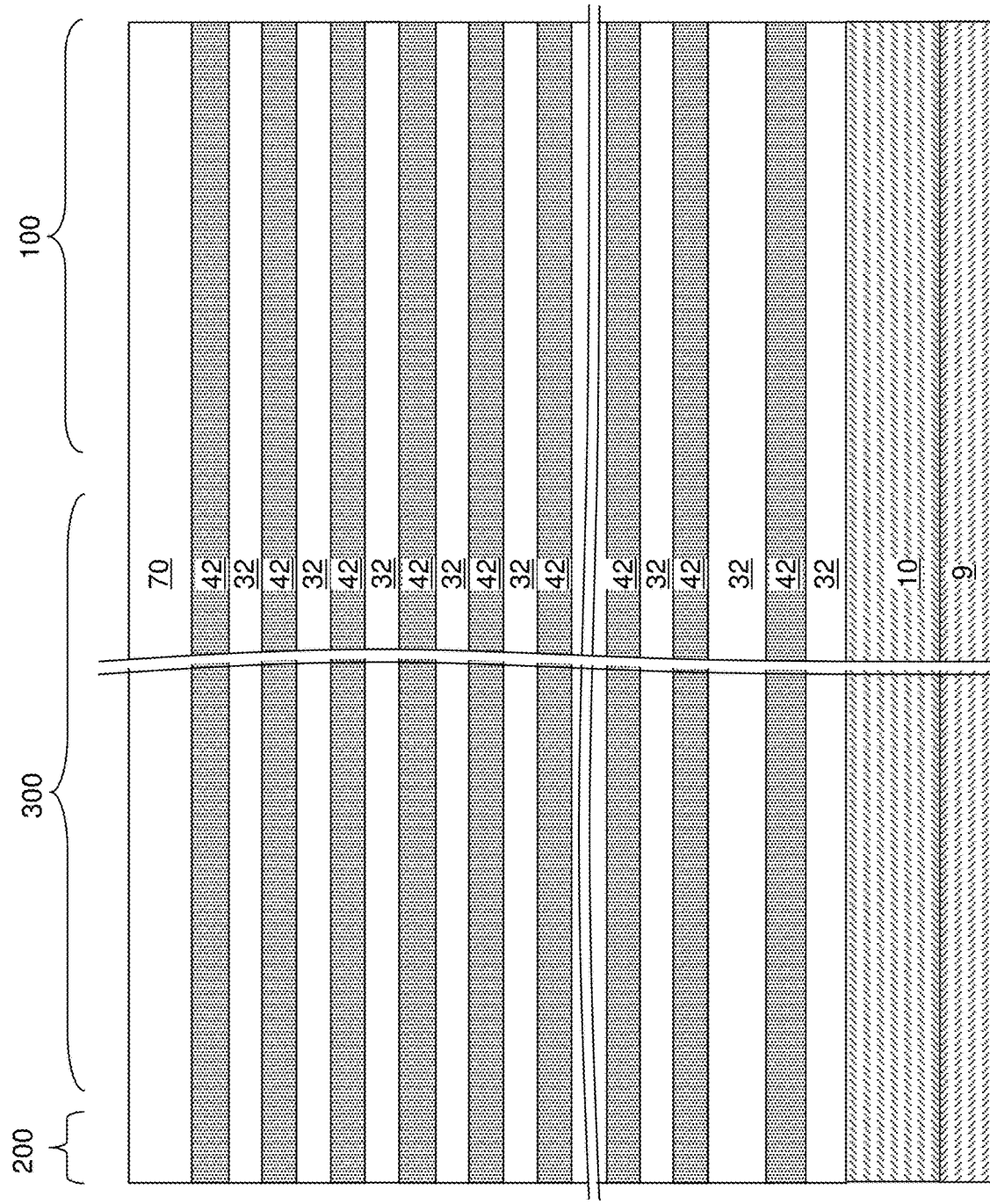
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The first exemplary structure may include a memory array region 100 in which memory stack structures are subsequently formed, a contact region 300 in which stepped surfaces are subsequently formed, and a peripheral region 200.

Figure 3:
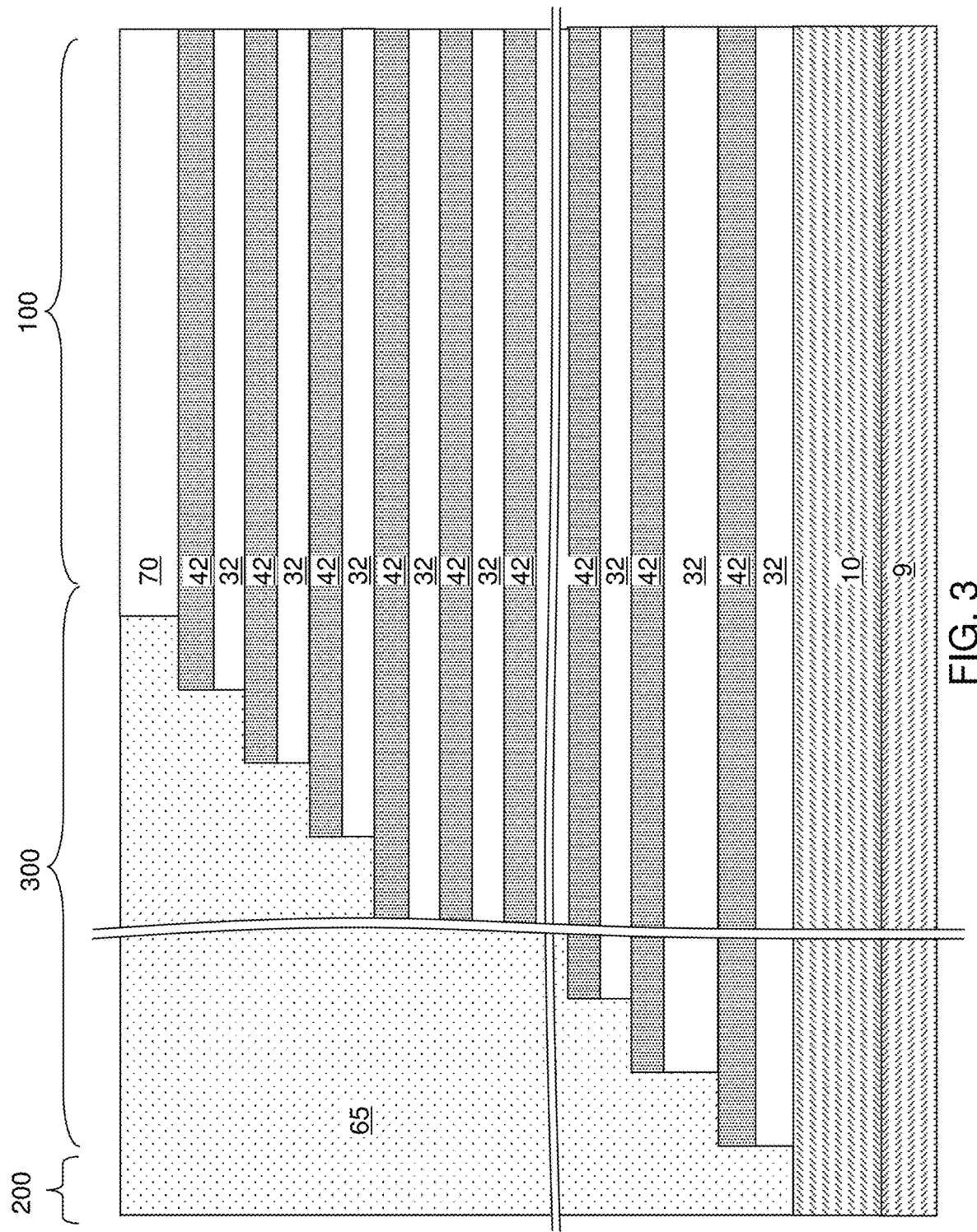
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed in the alternating stack (32, 42) in the contact region 300, which may also be referred to as a staircase region or a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
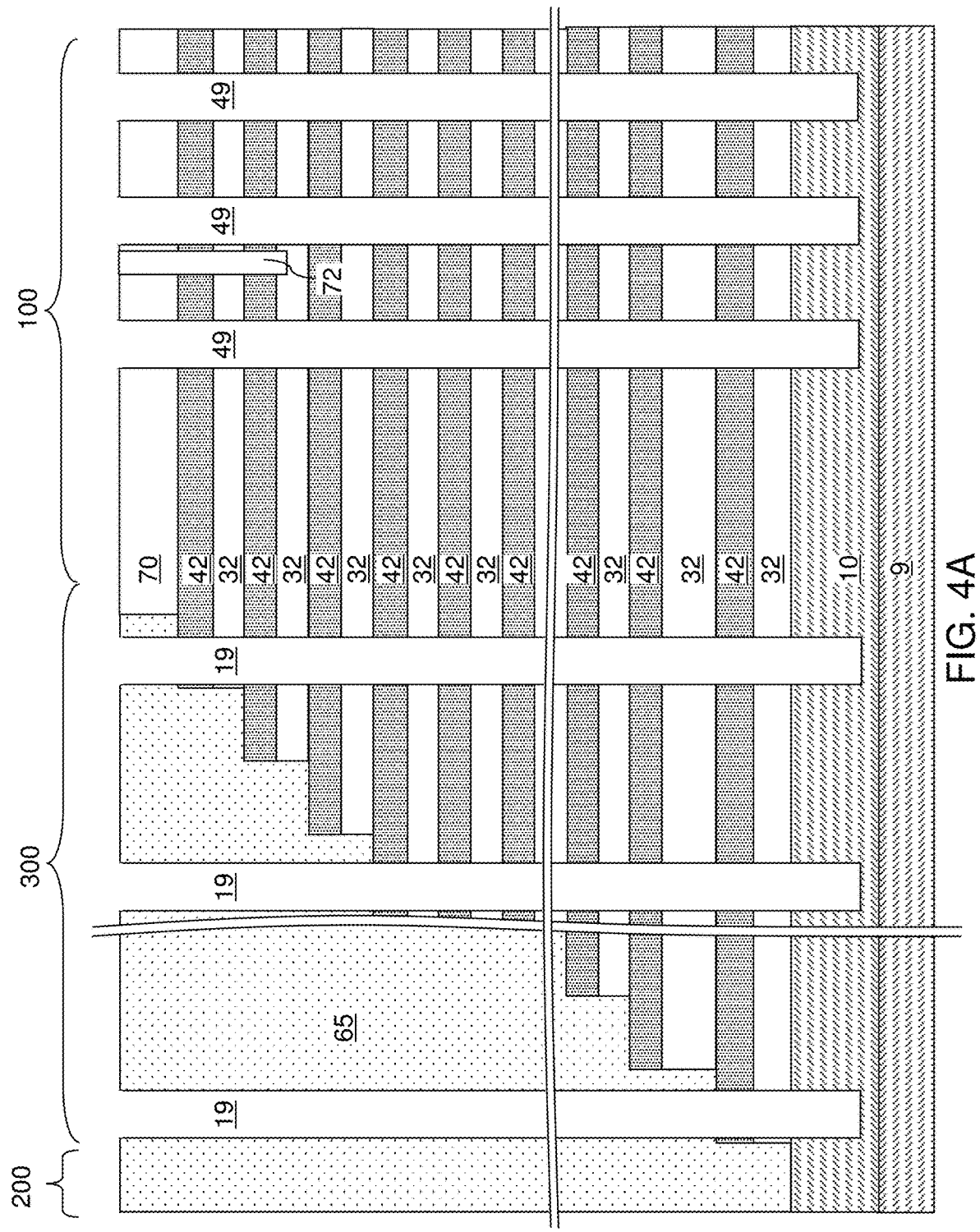
FIG. 4A is a schematic vertical cross-sectional view of the first exemplary structure after formation of memory openings and support openings according to an embodiment of the present disclosure.
Figure 4B:
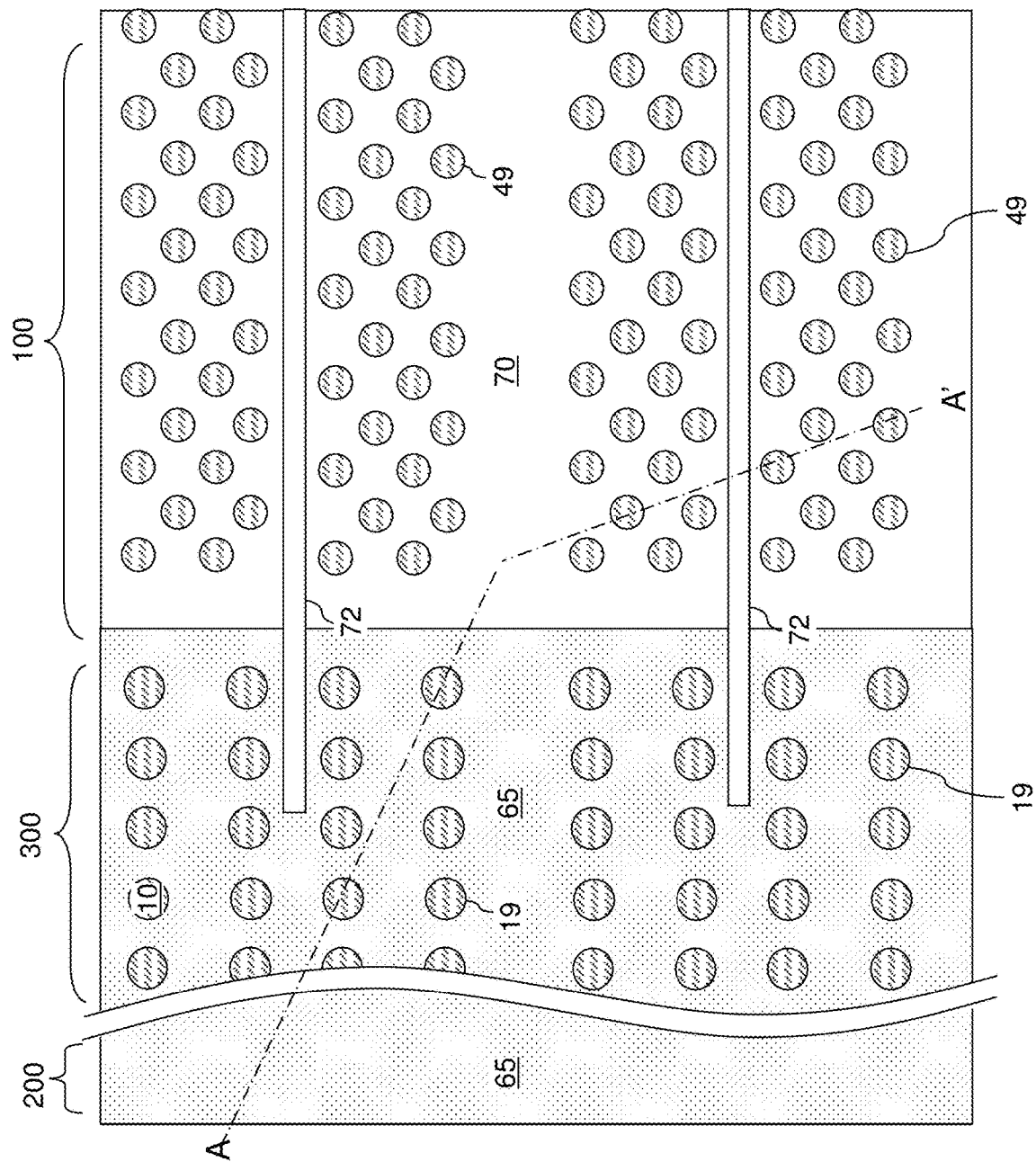
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate layer 9.

Figure 5:
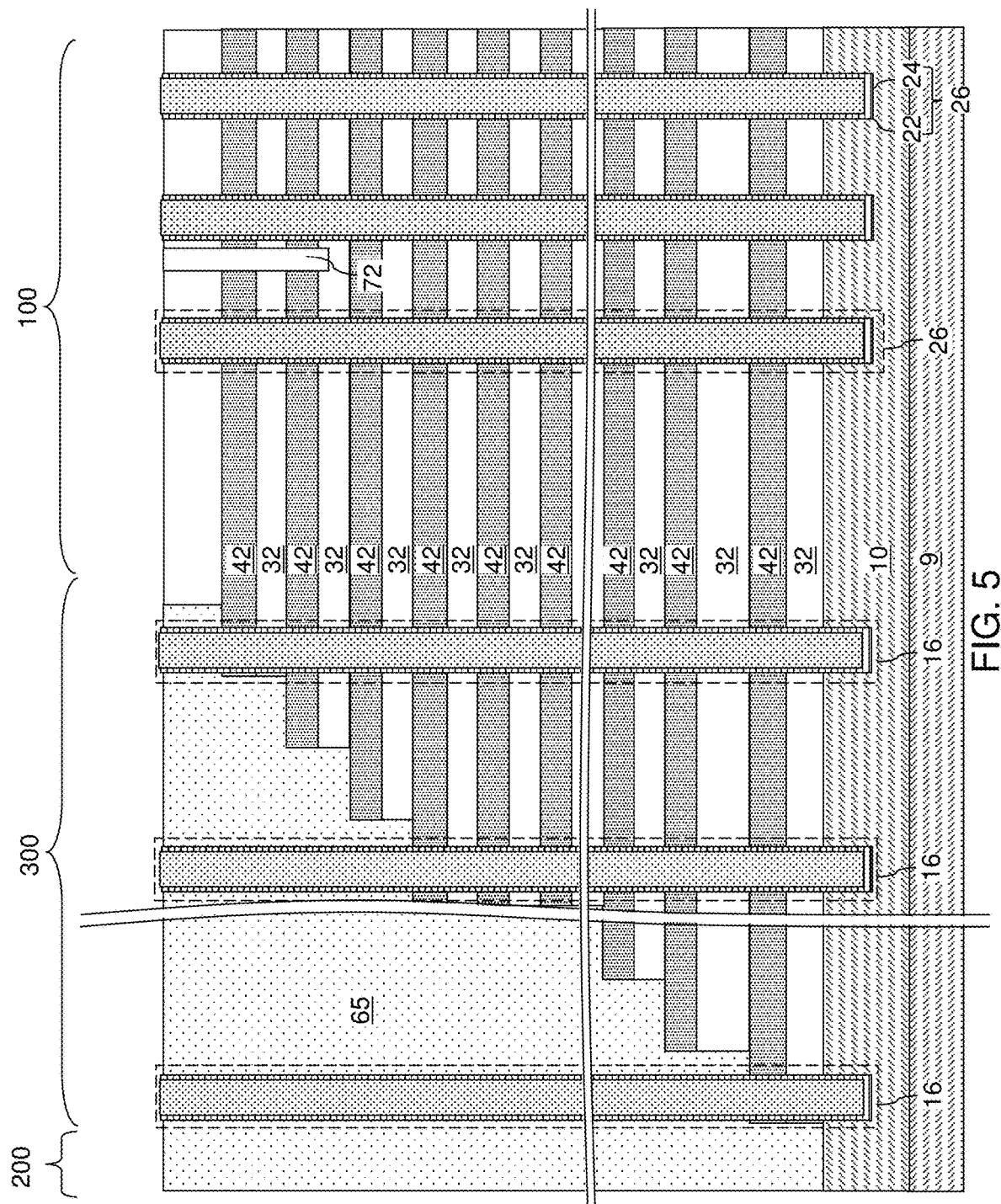
FIG. 5 is a schematic vertical cross-sectional view of the first exemplary structure after formation of sacrificial memory opening fill structures and sacrificial support opening fill structures according to an embodiment of the present disclosure.

Referring to FIG. 5, a material that can induce nucleation of a metallic material can be conformally deposited in the memory openings 49 and the support openings 19 to form a nucleation material liner 22. The nucleation material liner may include a semiconductor material that can react with a metal-containing precursor gas to induce deposition of a metal, such as tungsten from the metal-containing precursor gas, such as tungsten hexafluoride or tungsten pentachloride.

In an illustrative example, the nucleation material liner 22 may include, and/or may consist essentially of, a semiconductor material such as silicon, for example polysilicon or amorphous silicon. Alternatively, the nucleation material liner 22 may include, and/or may consist essentially of, boron, boron nitride, or a boron-silicon alloy. The thickness of the nucleation material liner 22 can be selected to be less than one half of the average thickness of the insulating layers 32, and may be in a range from 0.1% to 5%, such as from 0.2% to 2% of the average thickness of the insulating layers 32. In one embodiment, the thickness of the nucleation material liner 22 may be in a range from 0.5 nm to 5 nm, such as from 1 nm to 3 nm, although lesser and greater thicknesses may also be employed.

A sacrificial fill material can be deposited in remaining volumes of the memory openings 49 and the support openings 19 by a conformal or non-conformal deposition process. The sacrificial fill material may be any material that can be removed selective to the material of the insulating layers 32. In an illustrative example, the sacrificial fill material may include a carbon-based material, such as amorphous carbon or diamond-like carbon (DLC), a glass material, such as borosilicate glass or organosilicate glass that provide high etch rates in dilute hydrofluoric acid, or a semiconductor material, such as germanium or a silicon-germanium alloy.

Excess portions of the sacrificial fill material and the nucleation material liner 22 can be removed from above the horizontal plane including the top surface of the insulating cap layer 70 by performing a planarization process, which may employ a chemical mechanical polishing process and/or a recess etch process. The nucleation material liner 22 can be divided into multiple nucleation material liners 22 located within a respective one of the memory openings 49 or the support openings 19. Each remaining portion of the sacrificial fill material located in a memory opening 49 or in a support opening 19 constitutes a sacrificial fill material portion 24. Each combination of a nucleation material liner 22 and a sacrificial fill material portion 24 located in a memory opening 49 constitutes a sacrificial memory opening fill structure 26. Each combination of a nucleation material liner 22 and a sacrificial fill material portion 24 located in a support opening 19 constitutes a sacrificial support opening fill structure 16.

Figure 6A:
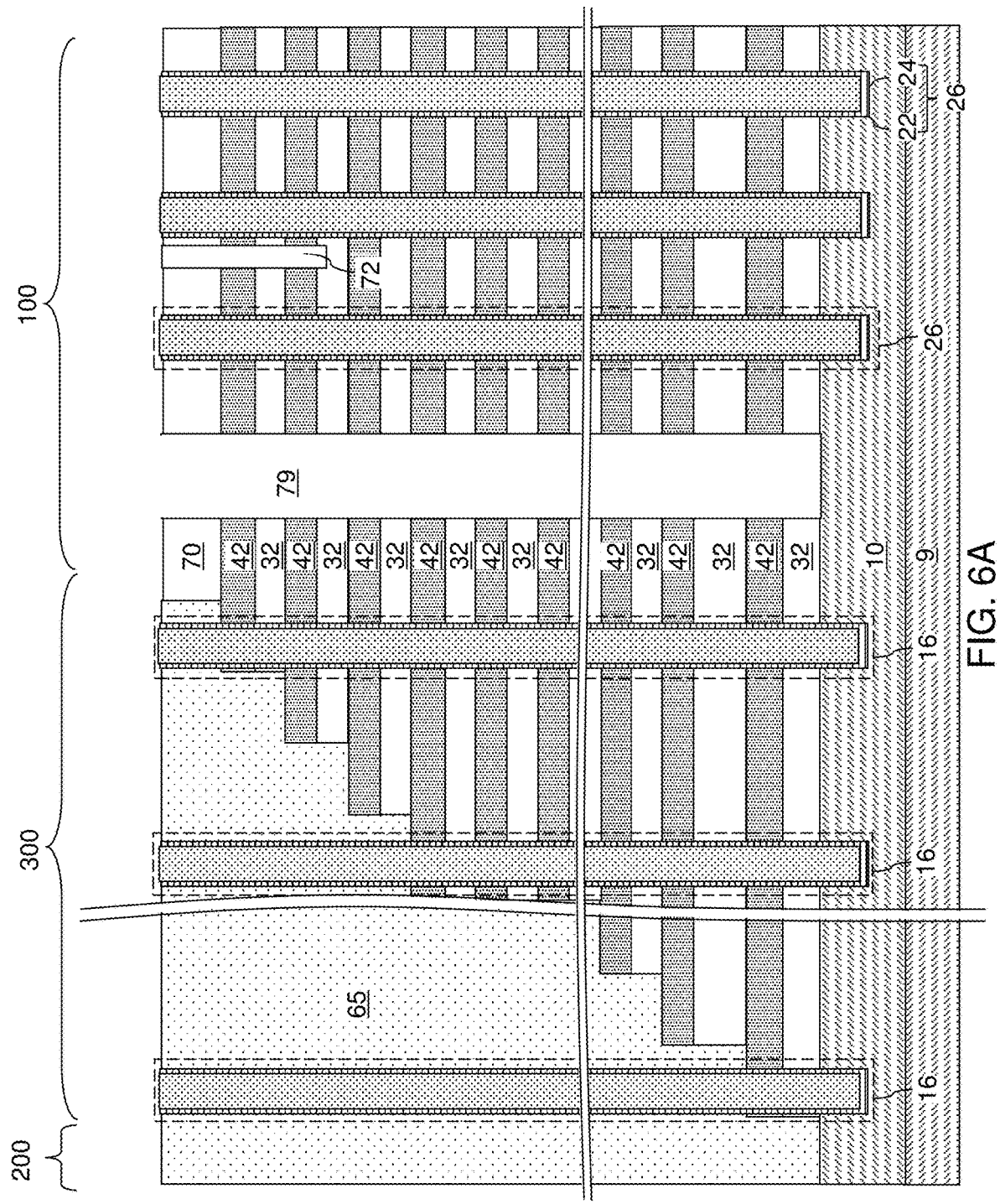
FIG. 6A is a schematic vertical cross-sectional view of the first exemplary structure after formation of backside trenches according to an embodiment of the present disclosure.

Referring to FIGS. 6A and 6B, a photoresist layer (not shown) can be applied over the alternating stack (32, 42), and can be lithographically patterned to form openings in areas between clusters of sacrificial memory opening fill structures 26. The pattern in the photoresist layer can be transferred through the alternating stack (32, 42) and the retro-stepped dielectric material portion 65 employing an anisotropic etch to form backside trenches 79, which vertically extend from the top surface of the insulating cap layer 70 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The sacrificial memory opening fill structures 26 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures 26 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 7:
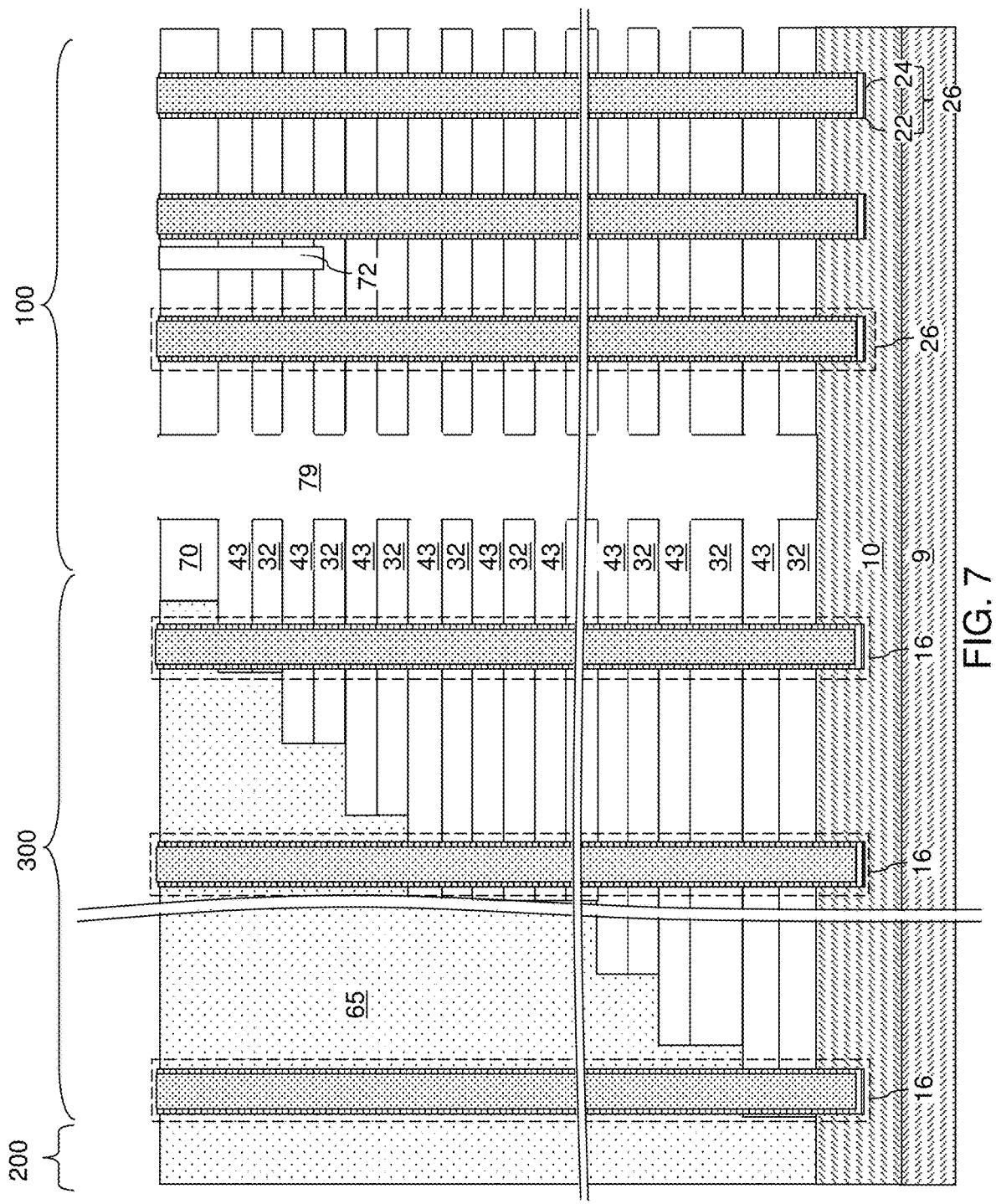
FIG. 7 is a schematic vertical cross-sectional view of the first exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the nucleation material liners 22. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the nucleation material liners 22 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, boron, boron alloys, and various other materials employed in the art. The sacrificial support opening fill structures 16, the retro-stepped dielectric material portion 65, and the sacrificial memory opening fill structures 26 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the sacrificial memory opening fill structures 26 are present are herein referred to as front-side openings or front-side cavities in contrast with the backside recesses 43. In this case, each backside recess 43 can define a space for receiving a respective word line of an array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 8:
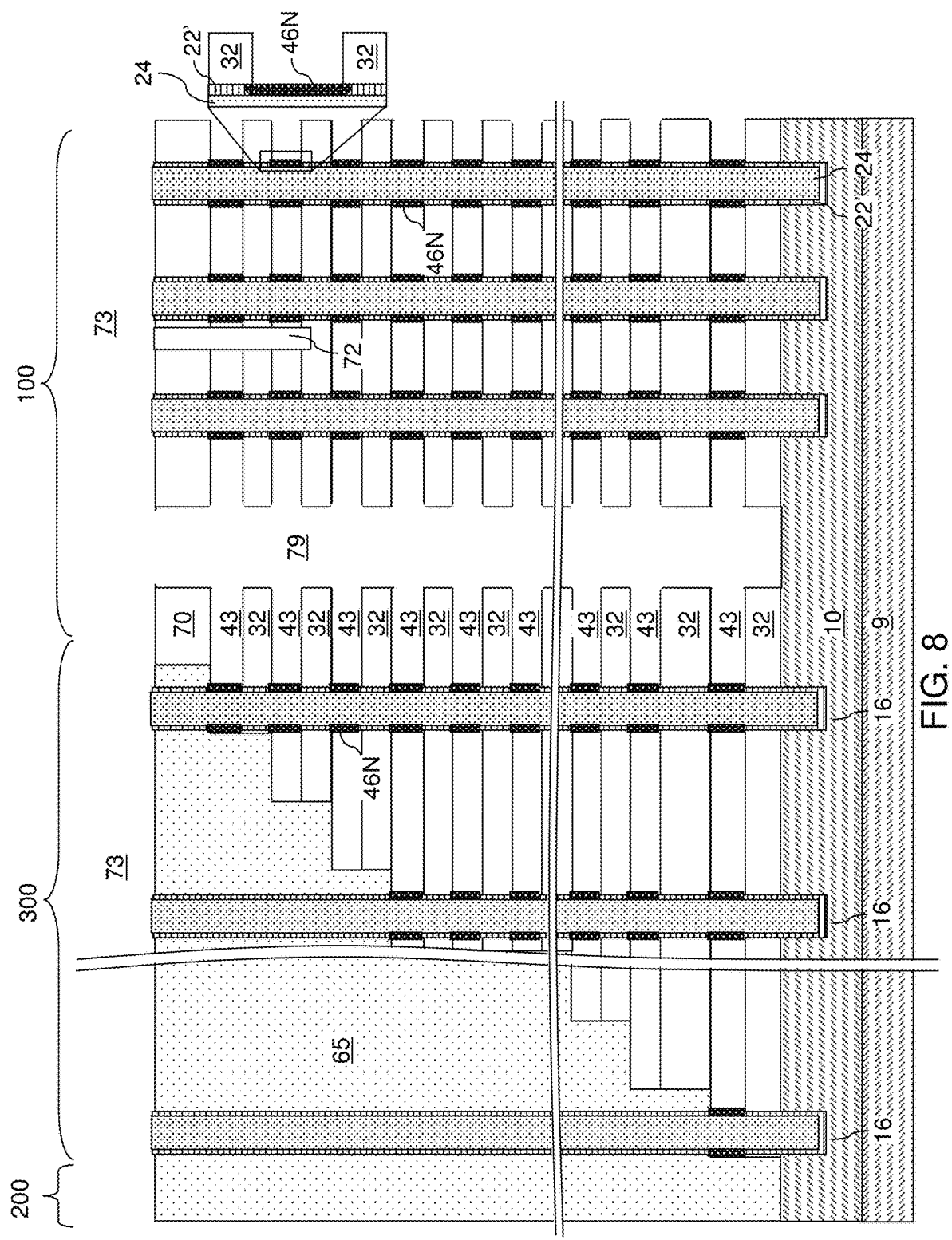
FIG. 8 is a schematic vertical cross-sectional view of the first exemplary structure after formation of tubular metallic liners according to an embodiment of the present disclosure.

Referring to FIG. 8, the first exemplary structure can be disposed in a vacuum process chamber, and a first metal-containing precursor gas can be flowed into the process chamber. The first metal-containing precursor gas can be supplied into the backside trenches 79 and into the backside recesses 43 in a deposition process, which may include an atomic layer deposition (ALD) process or a chemical vapor deposition (CVD) process. The molecules of the first metal-containing precursor gas include a first metallic element that can react with surface portions of the nucleation material liners 22 that are physically exposed to the backside recesses 43 and can form a first metallic material, i.e., a conductive material including at least one metal element.

In one embodiment, the first metal-containing precursor gas may include a transition metal element (such as tungsten, ruthenium, cobalt, molybdenum, titanium, tantalum, etc.) and a halide element such as fluorine or chlorine. In an illustrative example, the first metal-containing precursor gas may include tungsten hexafluoride or tungsten pentachloride.

Tubular metallic liners 46N can be formed by reacting the first metal-containing precursor gas including the first metallic element with surface portions of the nucleation material liners 22 that are physically exposed to the backside recesses 43. The first metallic material of the tubular metallic (i.e., electrically conductive) liners 46N comprises atoms of the first metallic element derived from the first metal-containing precursor gas. Unreacted portions of the nucleation material liners 22 comprise annular portions 22' of the nucleation material liners 22. The annular portions 22' of the nucleation material liners 22 contact an inner sidewall of a respective one of the insulating layers 32. Annular portions 22' of the nucleation material liners 22 located in a same memory opening 49 can be vertically spaced from each other, and can consist essentially of the material of the nucleation material liners 22 as initially formed. The annular portions 22' of the nucleation material liners 22 can contact a respective inner sidewall of the insulating layers 32 after formation of the tubular metallic liners 46N. A vertically alternating stack of metallic liners 46N and annular portions 22' of the nucleation material liners 22 is formed surrounding the respective memory openings 49 and support openings 19.

A plurality of tubular metallic liners 46N can be formed surrounding each memory opening 49. Each of the plurality of tubular metallic liners 46N can comprise a cylindrical outer sidewall having a closed upper edge and a closed lower edge and physically exposed to a respective one of the backside recesses 43. As used herein, a closed edge refers to an edge that does not have an end point. Each of the plurality of tubular metallic liners 46N can comprise an inner sidewall including a straight inner sidewall segment (which may, or may not, contact a cylindrical surface of a sacrificial fill material portion 24), an upper tilted convex surface segment connecting an upper edge of the straight inner sidewall segment to the closed upper edge of the cylindrical outer sidewall, and a lower tilted convex surface segment connecting a lower edge of the straight inner sidewall segment to the closed lower edge of the cylindrical outer sidewall. In one embodiment, the straight inner sidewall segment can contact a sidewall of a sacrificial fill material portion 24, the upper tilted convex surface segment may contact a concave surface of an annular portions 22' of the nucleation material liners 22, and the lower tilted convex surface segment may contact a concave surface of another annular portion 22' of the nucleation material liners 22. In one embodiment, at least one, or each, of the plurality of tubular metallic liners 46N can have a greater vertical extent than the backside recesses 43 to which the respective tubular metallic liner 46N is physically exposed.

In one embodiment, the first metallic element comprises tungsten. In this case the portions of the nucleation material liners 22 exposed in the backside recesses act as a seed for the tungsten deposition. For example, silicon, boron, boron nitride or boron-silicon alloy liners can act as a seed for tungsten deposition from tungsten hexafluoride or tungsten pentachloride. In this embodiment, the tungsten halide gas reacts with the silicon or boron liners to form tungsten metal tubular metallic liners 46N and a silicon halide or boron halide containing gas. The gas is removed from the device through the backside recesses 43 and the backside trenches 79. For example, tungsten hexafluoride source gas and a silicon seed material form a tungsten layer and silicon hexafluoride and/or tungsten silicon fluoride gas. Alternatively, tungsten pentafluoride source gas and a silicon or boron seed material form a tungsten layer and either a respective silicon tetrachloride gas or boron trichloride gas. In this embodiment, the seed material liner 22 is replaced with the tungsten metallic liner 46N.

The tungsten liners 46N may contain a residual trapped halogen (e.g., fluorine or chloride) and an optional silicon or boron alloying element from the nucleation material liners 22. For example, if the material of the nucleation material liners 22 comprises and/or consists essentially of silicon, then an average atomic percentage of silicon within the tubular metallic liners 46N may be at least 0.1%. For example, the average atomic percentage of silicon within the tubular metallic liners 46N may be in a range from 0.1% to 5.0%, such as 0.5% to 2% with the balance tungsten and other unavoidable impurities (e.g., trapped fluorine).

Alternatively, if the material of the nucleation material liners 22 comprises and/or consists essentially of boron, then an average atomic percentage of boron within the tubular metallic liners 46N may be at least 0.1%. For example, the average atomic percentage of boron within the tubular metallic liners 46N may be in a range from 0.1% to 5.0%, such as 0.5% to 2% with the balance tungsten and other unavoidable impurities (e.g., trapped fluorine).

In another alternative embodiment, the first metallic element comprises a silicide forming metal, such as Co, Mo or Ru, and the material of the nucleation material liners 22 comprises and/or consists essentially of silicon. In this embodiment, the silicide forming metal reacts with the silicon to form metal silicide tubular metallic liners 46N. The metal silicide may comprise cobalt silicide (e.g., $CoSi_2$, $Co_2Si$, $CoSi$ or non-stoichiometric versions thereof), molybdenum silicide ($MoSi_2$ or non-stoichiometric versions thereof) or ruthenium silicide (e.g., $Ru_2Si_3$ or non-stoichiometric versions thereof).

Thus, the tubular metallic liners 46N are selectively deposited in the backside recesses 43 around the memory openings 49 which are filled with the sacrificial memory opening fill structures 26. The lateral thickness of each tubular metallic liner 46N may be about the same as or greater than the thickness of the nucleation material liner 22. For example, the lateral thickness of each tubular metallic liner 46N may be in a range from 0.5 nm to 5 nm, such as from 1 nm to 3 nm, although lesser and greater thicknesses may also be employed.

Figure 9:
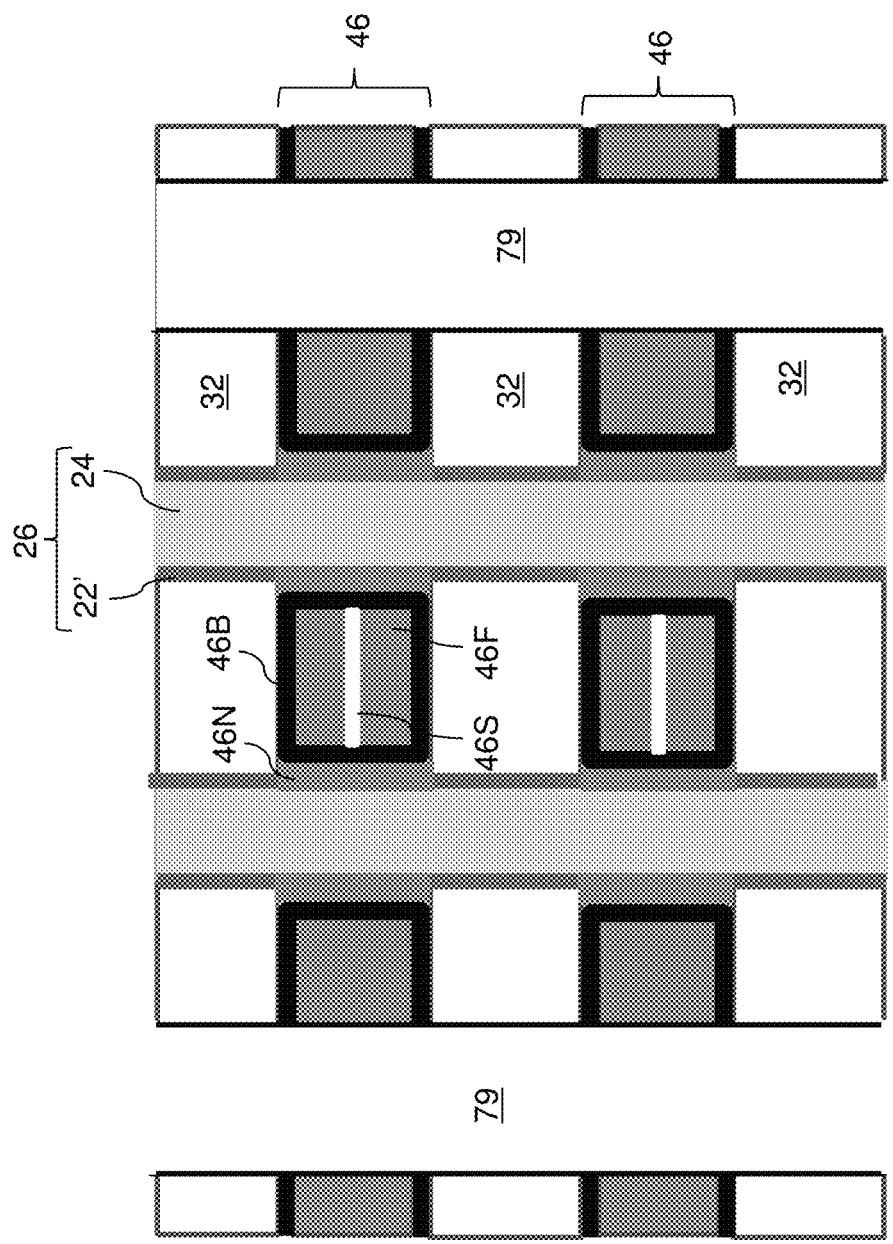
FIG. 9 is a schematic vertical cross-sectional view of a portion of the first exemplary structure of FIG. 8 after formation of metallic fill material layers according to an embodiment of the present disclosure.

Referring to FIG. 9, an electrically conductive barrier layer 46B and a metallic fill material layer 46F can be non-selectively deposited in the backside recesses 43 on the physically exposed surfaces of the tubular metallic liners 46N through the backside trenches 79. The electrically conductive barrier layer 46B may be deposited directly on the tubular metallic liners 46N and on the exposed surfaces of the insulating layers 32 in the backside recesses 43. The electrically conductive barrier layer 46B may comprise titanium nitride, tungsten nitride, tungsten boronitride or tungsten carbonitride.

The metallic fill material layer 46F can be deposited in the remaining spaces of the backside trenches 79 directly on the electrically conductive barrier layer 46B. The metallic fill material layer 46F can have the same or a different material composition than the tubular metallic liners 46N. The metallic fill material layer 46F may comprise W, Ti, Ta, Co, Mo or Ru. The metallic fill material layer 46F and the electrically conductive barrier layer 46B may be deposited by ALD or CVD.

An anisotropic etch process can be performed to remove excess portions of the metallic fill material layers 46F and the electrically conductive barrier layer 46B that laterally protrude into volumes of the backside trenches 79. Sidewalls of remaining portions of the metallic fill material layers 46F around the backside trenches 79 may be vertically coincident with sidewalls of the insulating layers 32 around the backside trenches 79.

In one embodiment, the metallic fill material layer 46F entirely fills the remaining volume of the backside recesses 43. In an alternatively embodiment, the metallic fill material layer 46F does not completely fill the remaining volume of the backside recesses 43. Laterally-extending seams (e.g., air-gaps) 46S can be formed at locations at which vertical growth surfaces of the metallic fill material layers 46F merge. The laterally-extending seams 46S can be equidistant from a respective most proximal pair of the sacrificial memory opening fill structures 26.

Each contiguous combination of a metallic fill material layer 46F, an electrically conductive barrier layer 46B and a respective plurality of tubular metallic liners 46N constitutes an electrically conductive layer 46. In one embodiment, an electrically conductive layer 46 may comprise at least one laterally-extending seam 46S therein. In one embodiment, each of the electrically conductive layers 46 may comprise a plurality of tubular metallic liners 46N in contact with a respective outer sidewall segment of each of the sacrificial memory opening fill structures 26, an electrically conductive barrier layer 46B contacting each of the plurality of tubular metallic liners 46N, and a metallic fill material layer 46F contacting the electrically conductive barrier layers 46B. In one embodiment, the tubular metallic liners 46N include at least one element (such as silicon or boron) that is not present within the a metallic fill material layer 46F.

In one embodiment, the tubular metallic liners 46N comprise, and/or consist essentially of a metal silicide, and the metallic fill material layers 46F comprise, and/or consist essentially of tungsten. In another embodiment, the tubular metallic liners 46N comprise, and/or consists essentially of, silicon-doped and/or boron-doped tungsten, and the metallic fill material layers 46F comprise, and/or consist essentially of tungsten that is not doped with silicon or boron.

Figure 10:
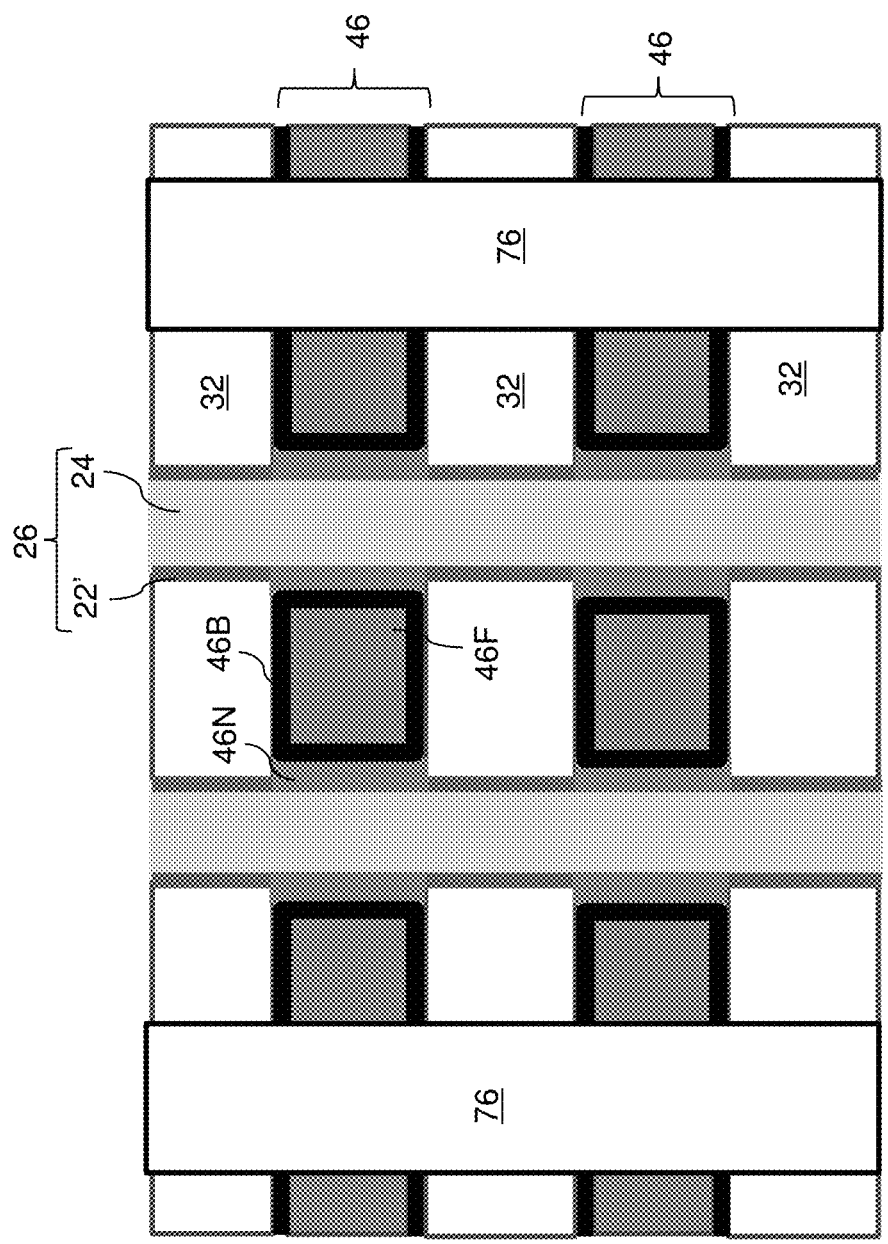
FIG. 10 is a schematic vertical cross-sectional view of the first exemplary structure after formation of backside trench fill structures according to an embodiment of the present disclosure.

Referring to FIG. 10, backside trench fill structures 76 can be formed in the backside trenches 79, for example, by conformally depositing a dielectric material such as silicon oxide in the backside trenches. Alternatively, the backside trench fill structures 76 may comprise a dielectric spacer (e.g., a silicon oxide spacer) and an electrically conductive local interconnect.

Figure 11:
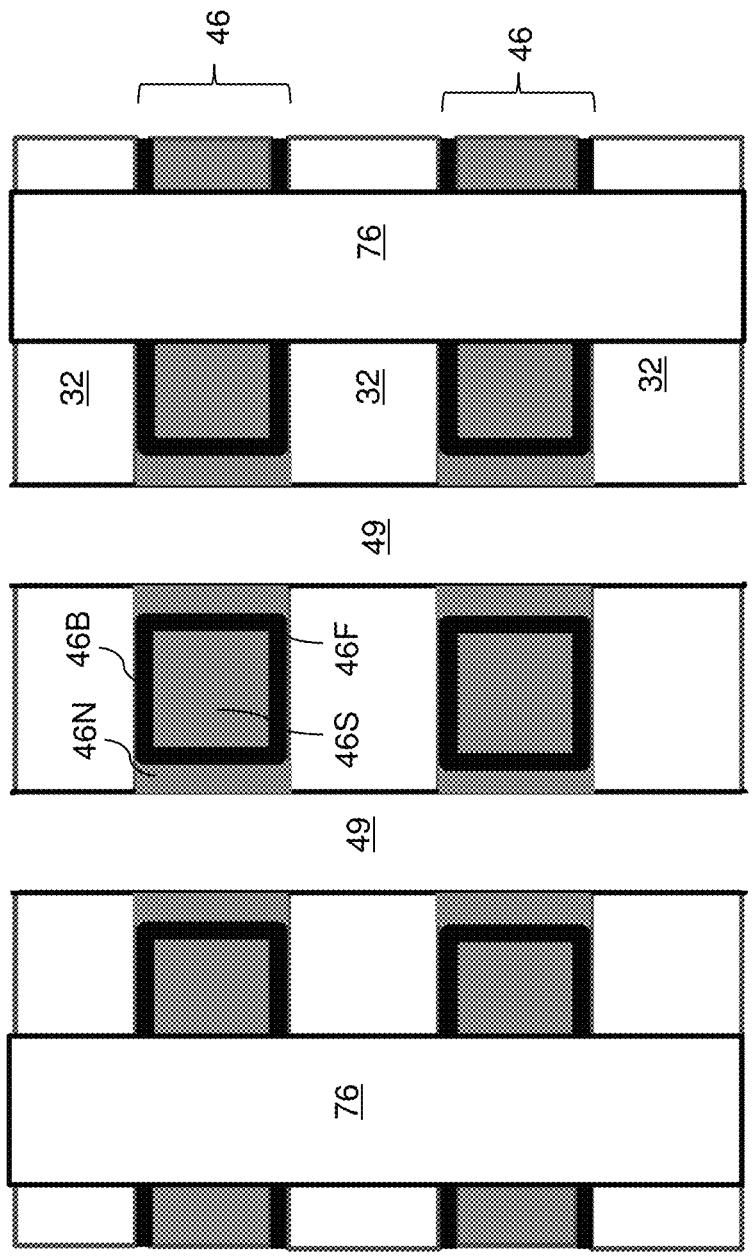
FIG. 11 is a schematic vertical cross-sectional view of the first exemplary structure after removal of sacrificial memory opening fill structures and sacrificial support opening fill structures according to an embodiment of the present disclosure.

Referring to FIG. 11, the sacrificial memory opening fill structures 26 and sacrificial support opening fill structures 16 can be removed selective to the materials of the insulating layers 32 and the electrically conductive layers 46 to expose the support openings 19 and the memory openings 49. For example, an etch process or an ashing process may be performed to remove the sacrificial fill material portions 24 selective to the material of the tubular metallic liners 46N. The etch process or the ashing process may be selective to the remaining portions of the nucleation material liners 22, i.e., the annular portions 22' of the nucleation material liners 22. Subsequently, the annular portions 22' of the nucleation material liners 22 may be removed by performing an isotropic etch process that etches the material of the nucleation material liners 22 selective to the material of the tubular metallic liners 46N and selective to the insulating layers 32. For example, if the annular portions 22' of the nucleation material liners 22 comprise silicon, then a wet etch process employing a KOH solution, a hot trimethyl-2 hydroxyethyl ammonium hydroxide ("hot TMY") solution, and/or a tetramethyl ammonium hydroxide (TMAH) solution may be employed.

Figure 12:
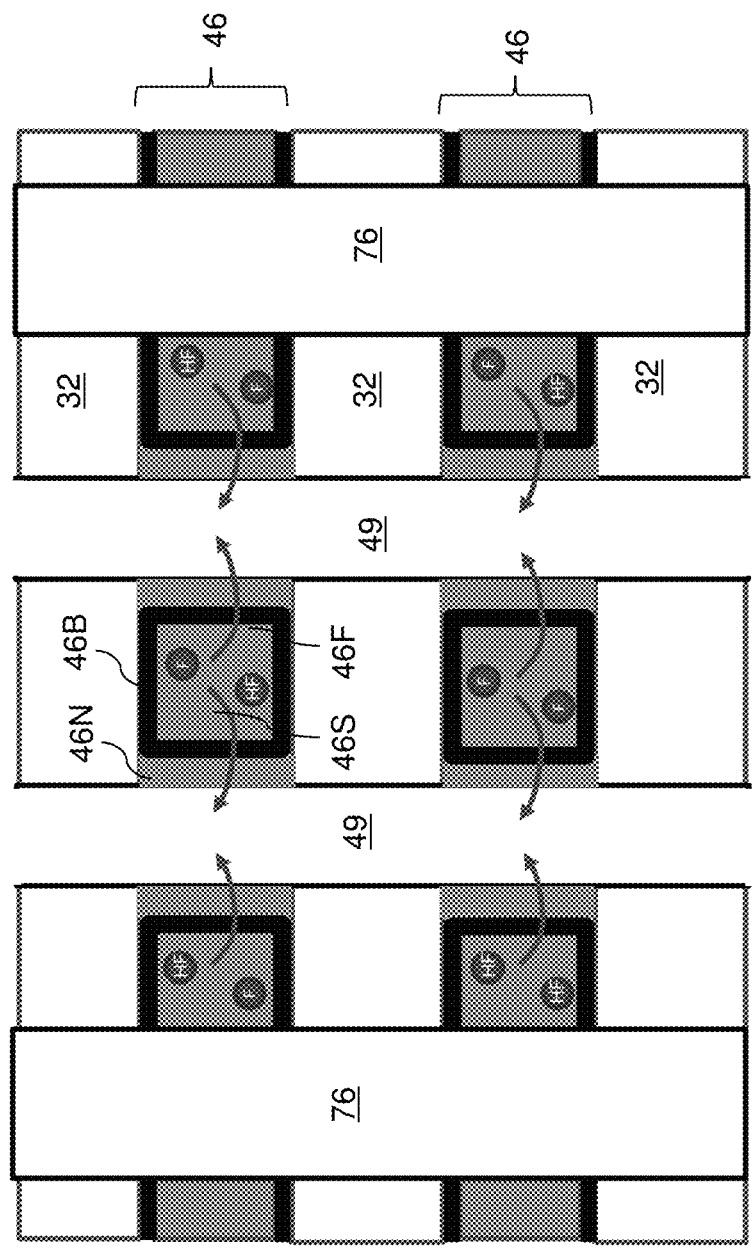
FIG. 12 is a schematic vertical cross-sectional view of the first exemplary structure during a halogen outgassing anneal.

Referring to FIG. 12, a halogen outgassing anneal may be performed to remove the halogen trapped in the seams 46S and/or in the metallic fill material layers 46F. The anneal may be conducted at a temperature of at least 800 degrees Celsius, such as 800 to 1,000 degrees Celsius. During the anneal, the halogen, such as fluorine, chlorine and/or hydrofluoric acid vapor that remains from the tungsten hexafluoride or tungsten pentachloride source gas is removed through the unfilled support openings 19 and memory openings 49. The halogen can degas through grain boundaries of the polycrystalline electrically conductive barrier layer 46B and tubular metallic liner 46N.

Figure 13A:
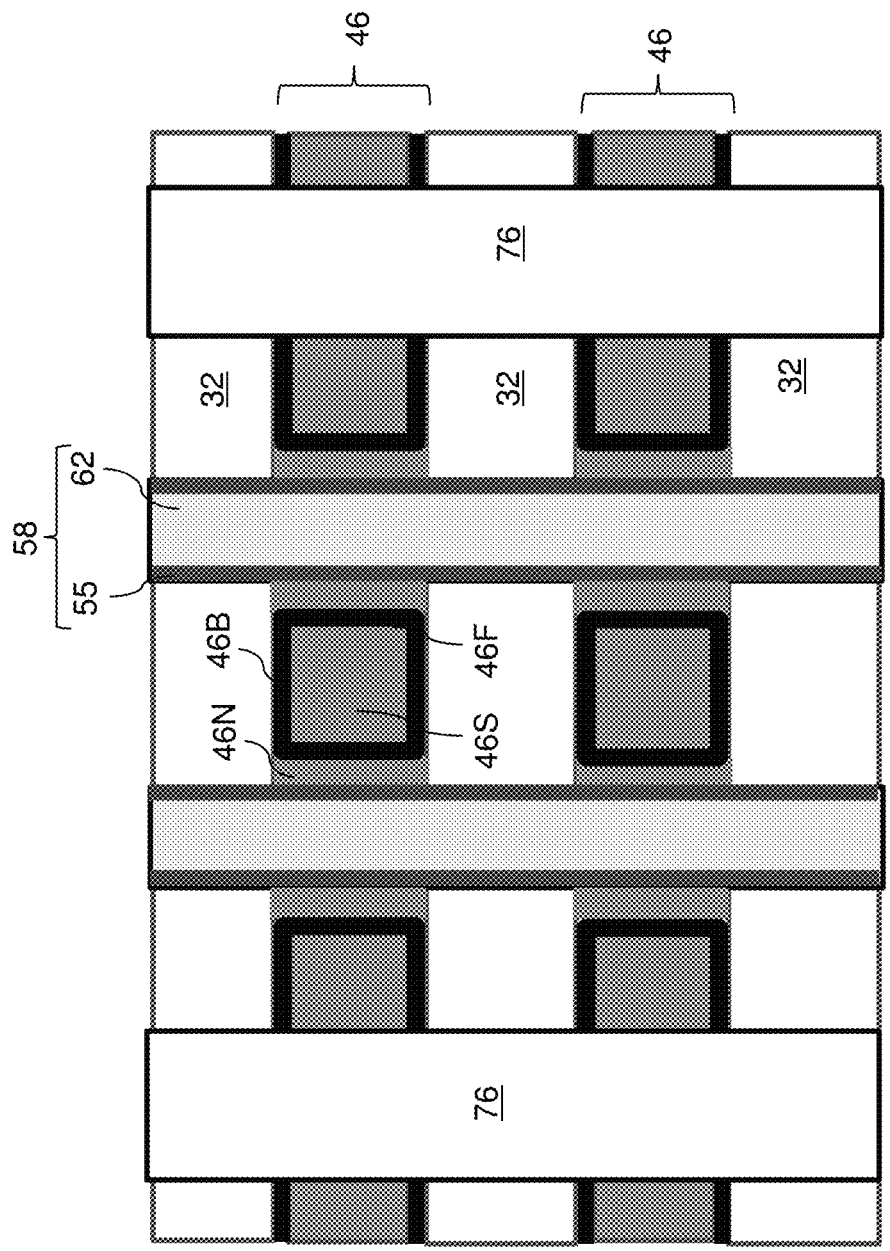
FIG. 13A is a schematic vertical cross-sectional view of the first exemplary structure after formation of memory opening fill structures.
Figure 14:
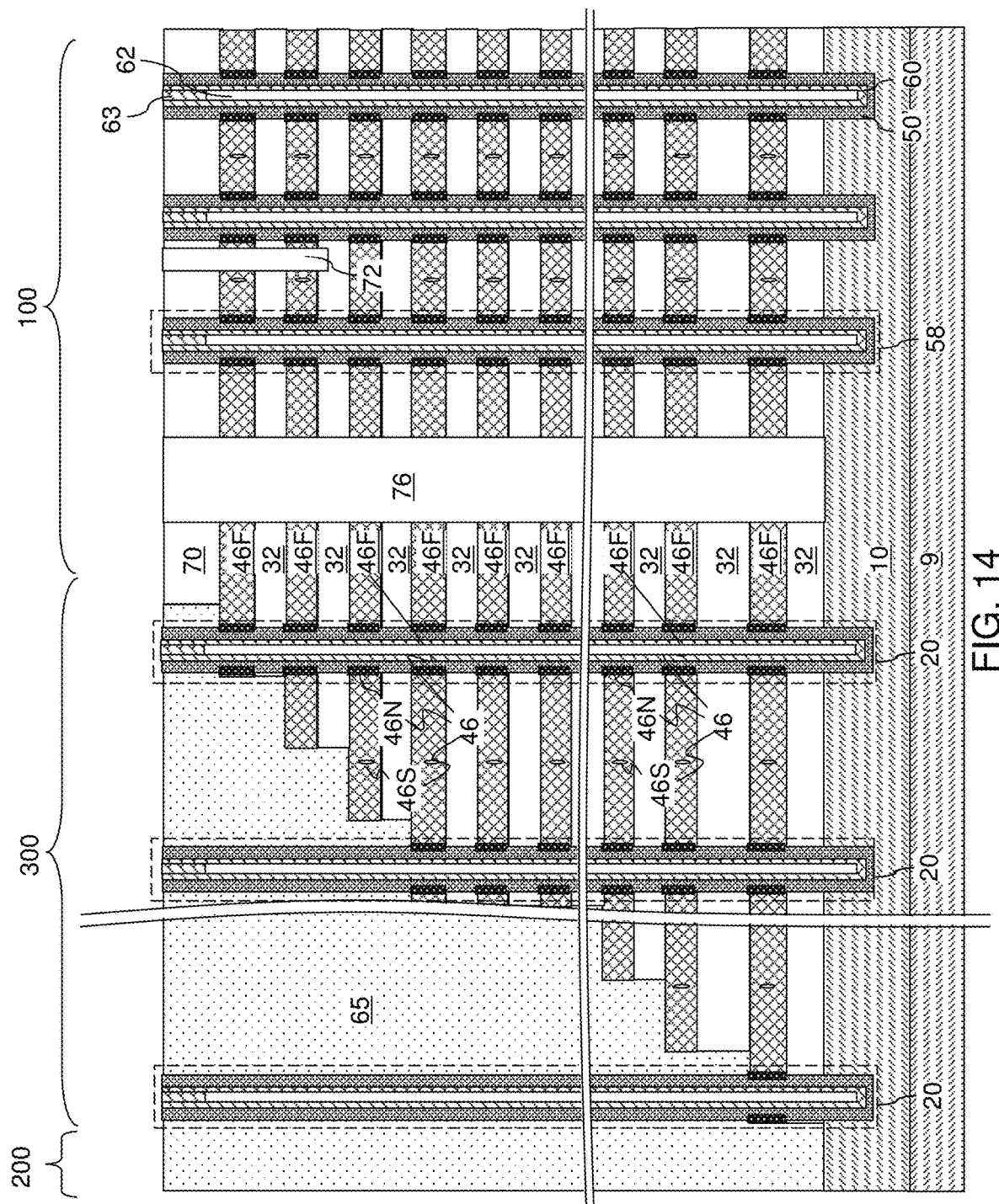
FIG. 14 is a schematic vertical cross-sectional view of the first exemplary structure after formation of memory stack structures and support pillar structures according to an embodiment of the present disclosure.

FIG. 13A is a schematic vertical cross-sectional views of memory openings within a portion of the first exemplary structure after formation of a memory opening fill structure 58. FIG. 13B is a close up view of the layers of the memory opening fill structure 58. FIG. 14 is an expanded view of the first exemplary structure after formation of the memory opening fill structures 58.

A stack of layers for forming a memory film and a vertical semiconductor channel within each memory opening 49 may be formed by conformal deposition processes. The stack of layers can comprise a blocking dielectric layer 52, a memory material layer 54, an optional tunneling dielectric layer 56, and a vertical semiconductor channel 60.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can include an aluminum oxide and a silicon oxide bilayer.

Subsequently, the memory material layer 54 can be formed. Generally, the memory material layer 54 can include any material that can store data in the form of presence or absence of electrical charges therein, a direction of ferroelectric polarization, or resistivity of a material therein. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates). In another embodiment, the memory material layer 54 includes a ferroelectric material layer, such as orthorhombic hafnium oxide doped with at least one of Zr, Si or Al. In one embodiment, the sacrificial material layers 42 and the insulating layers 32 can have vertically coincident sidewalls, and the memory material layer 54 can be formed as a single continuous layer.

The tunneling dielectric layer 56, if present, includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The tunneling dielectric layer 56, the memory material layer 54, and the blocking dielectric layer 52 collectively comprise a memory film 50 located within a respective one of the memory openings 49 or the support openings 19.

The vertical semiconductor channel 60 includes a semiconductor material, such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes amorphous silicon or polysilicon. The vertical semiconductor channel 60 can be formed by a conformal deposition method such as low pressure chemical vapor deposition (LPCVD) and have a thickness in a range from 2 nm to 30 nm, although lesser and greater thicknesses can also be employed.

In case the memory opening 49 is not completely filled by the vertical semiconductor channel 60, an optional dielectric core 62 fills any remaining portion of the memory opening. The dielectric core 62 includes a dielectric material such as silicon oxide or organosilicate glass. The dielectric core 62 can be deposited by a conformal deposition method such as low pressure chemical vapor deposition (LPCVD), or by a self-planarizing deposition process such as spin coating.

A drain region 63 comprising a semiconductor material a doping of a second conductivity type that is the opposite of the first conductivity type of the vertical semiconductor channel 60 is located in a recessed region above the dielectric core 62. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Each combination of a memory film 50 and a vertical semiconductor channel 60 constitutes a memory stack structure 55. A contiguous combination of a memory film 50, a vertical semiconductor channel 60, a dielectric core 62, and a drain region 63 in a memory opening 49 constitutes a memory opening fill structure 58. A contiguous combination of a memory film 50, a vertical semiconductor channel 60, a dielectric core 62, and a drain region 63 in a support opening 19 constitutes a support pillar structure 20 which is shown in FIG. 14. In one embodiment, each memory film 50 can store electrical charges with a macroscopic retention time. As used herein, a macroscopic retention time refers to a retention time suitable for operation of a memory device as a permanent memory device such as a retention time in excess of 24 hours.

In one embodiment, each of the memory films 50 comprises a respective blocking dielectric layer 52 and a respective memory material layer 54. In one embodiment, the respective blocking dielectric layer 52 and the respective memory material layer 54 can have a lesser maximum lateral extent at a level of one of the electrically conductive layers 46 than at a level of an insulating layer 32 contacting a top surface of the one of the electrically conductive layers 46, and than at a level of another insulating layer 32 contacting a bottom surface of the one of the electrically conductive layers 46. In one embodiment, the respective blocking dielectric layer 52 and the respective memory material layer 54 can have a lesser maximum lateral extent at each level of the electrically conductive layers 46 than at a level of a respective overlying insulating layer (which may be an insulating layer 32 or an insulating cap layer 70) contacting a top surface of a respective electrically conductive layer 46, and than at a level of another insulating layer 32 contacting a bottom surface of the respective electrically conductive layers 46.

Referring to FIG. 14, the first exemplary structure is illustrated after the processing steps of FIGS. 13A and 13B. A memory opening fill structure 58 is present within each memory opening 49, and a support pillar structure 20 is present within each support opening 19.

Figure 15A:
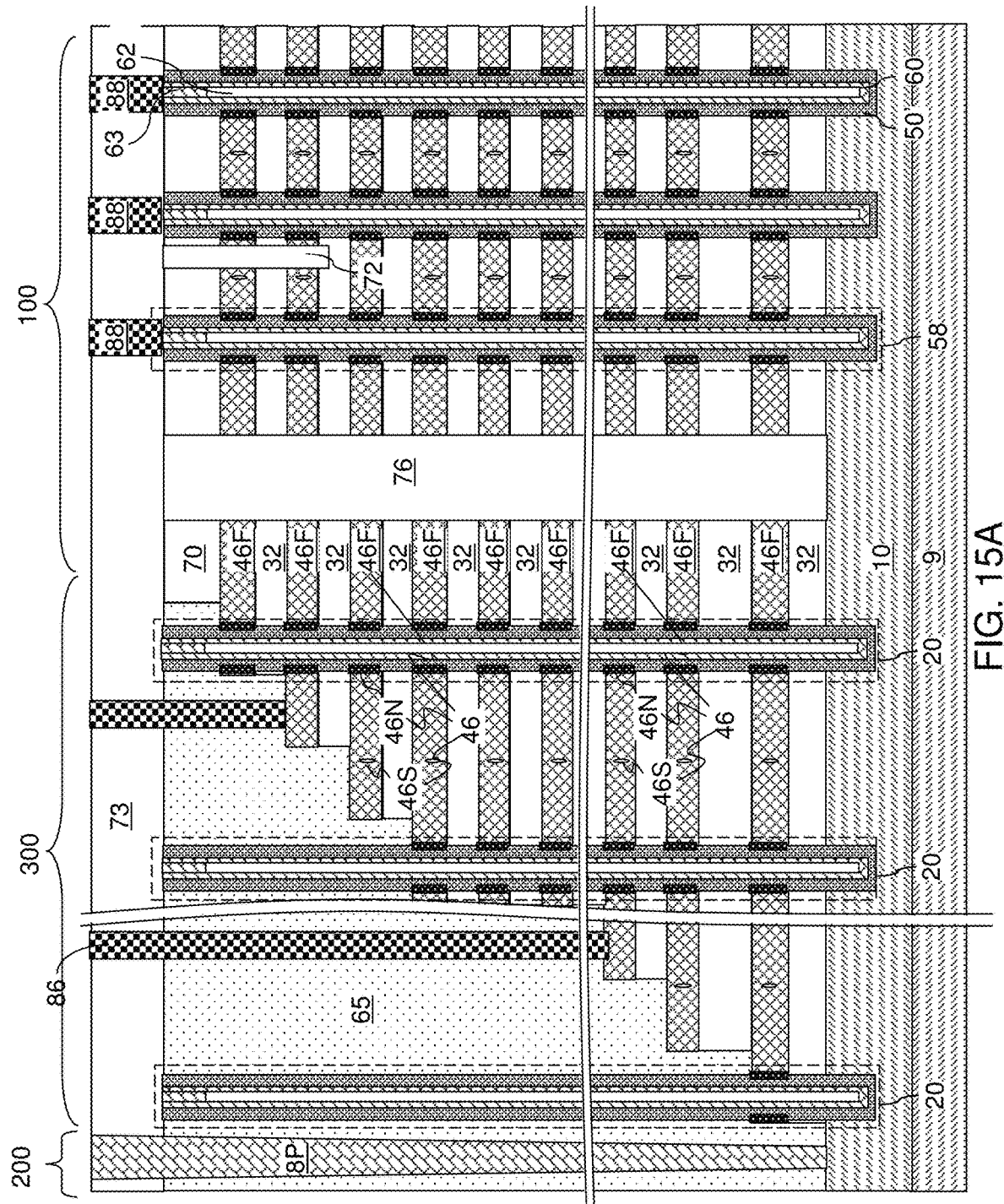
FIG. 15A is a schematic vertical cross-sectional view of the first exemplary structure after formation of additional contact via structures according to an embodiment of the present disclosure.
Figure 15B:
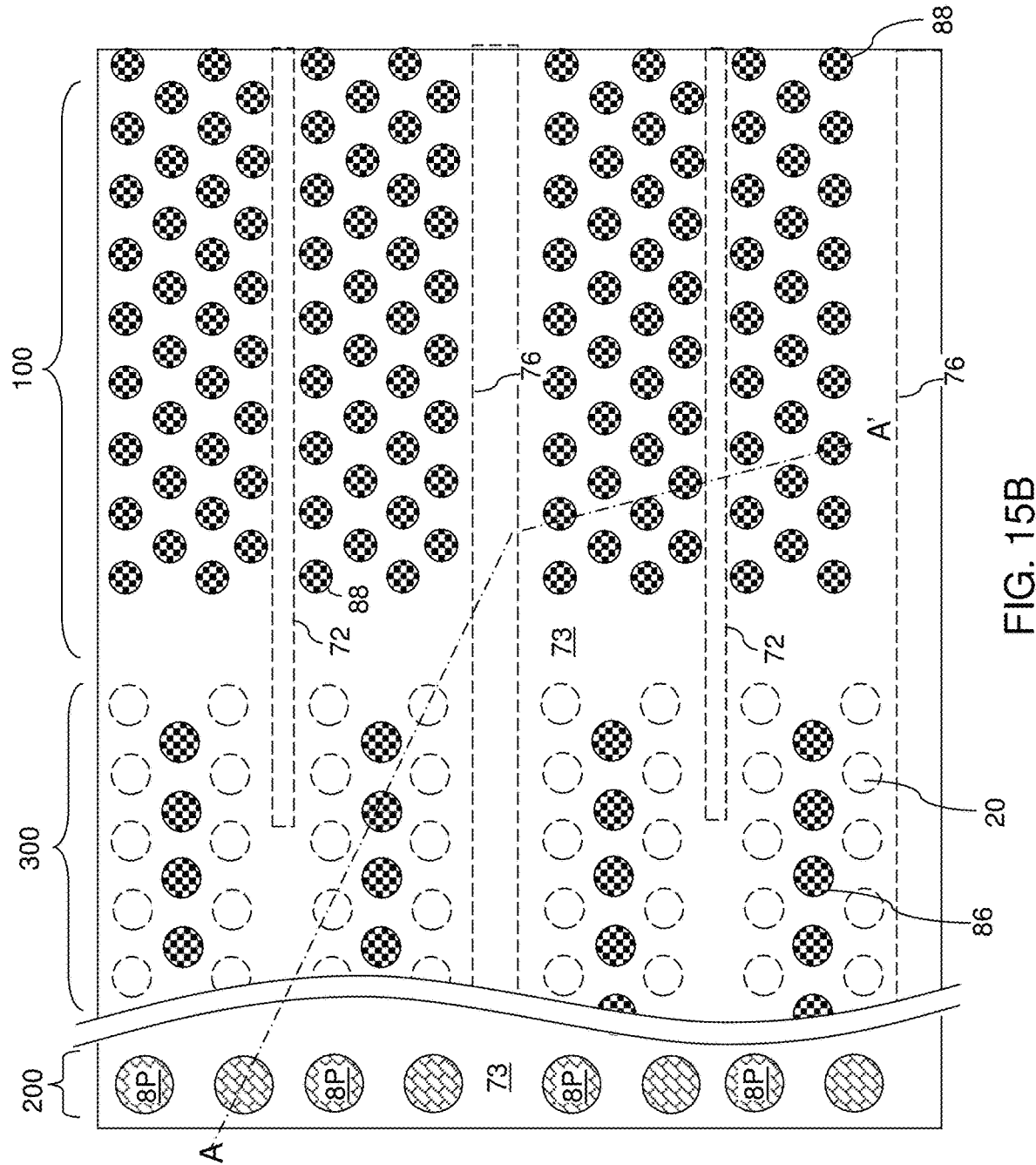
FIG. 15B is a top-down view of the first exemplary structure of FIG. 15A. The vertical plane A-A' is the plane of the schematic vertical cross-sectional view of FIG. 15A.

Referring to FIGS. 15A and 15B, a contact-level dielectric layer 73 can be formed over the alternating stack of insulating layers 32 and electrically conductive layers 46 and over the retro-stepped dielectric material portion 65 by deposition of a dielectric material such as silicon oxide. Contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63.

Word line contact via structures 86 can be formed on the electrically conductive layers 46 through the contact-level dielectric layer 73 and the retro-stepped dielectric material portion 65. Pass-through via structures 8P can be formed through the contact-level dielectric layer 73 and the retro-stepped dielectric material portion 65 directly on a top surface of the semiconductor material layer 10 in the peripheral region 200.

Figure 16A:
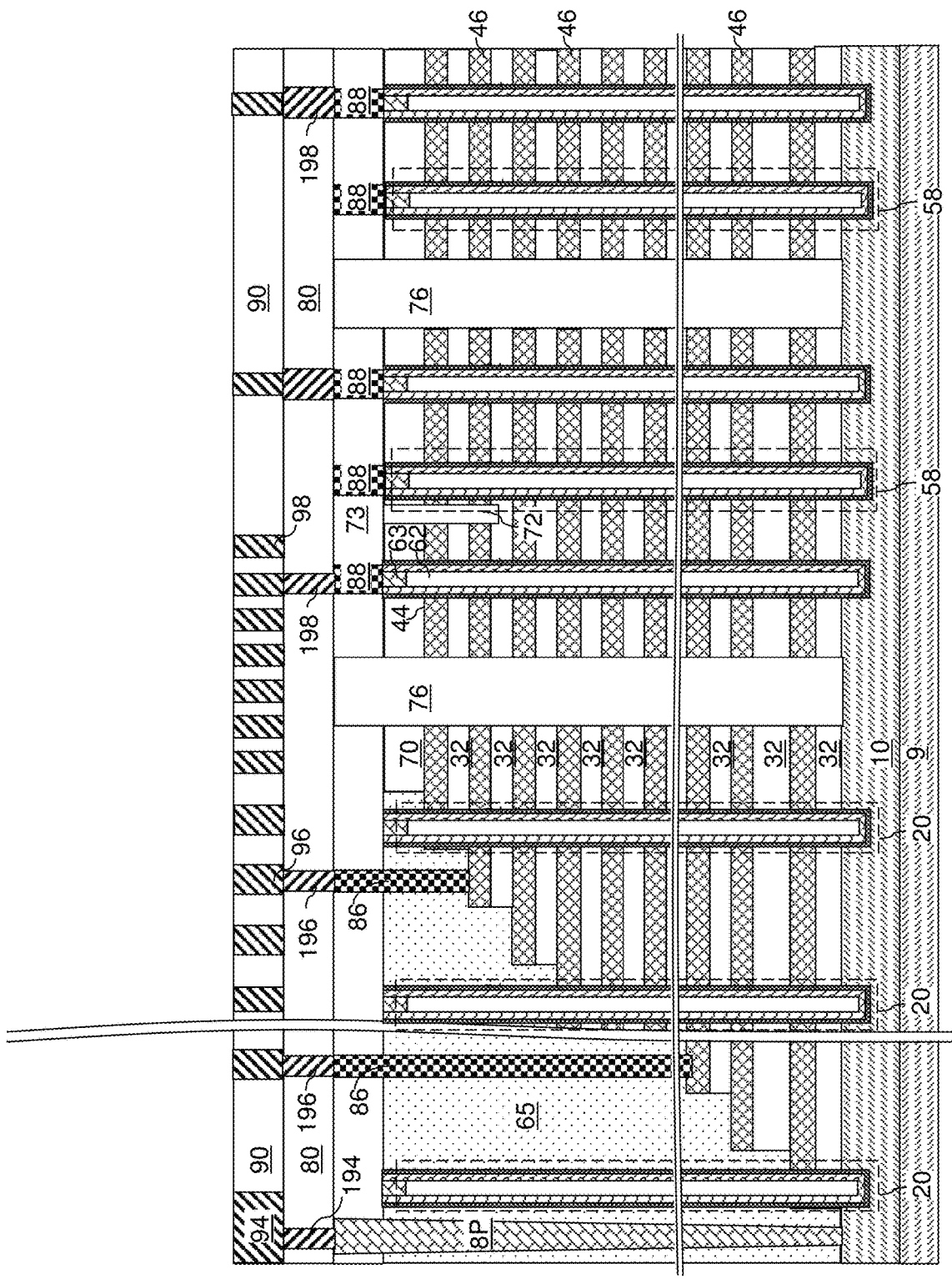
FIG. 16A is a schematic vertical cross-sectional view of the first exemplary structure after formation of first via level metal interconnect structures and first line level metal interconnect structures according to an embodiment of the present disclosure.
Figure 16B:
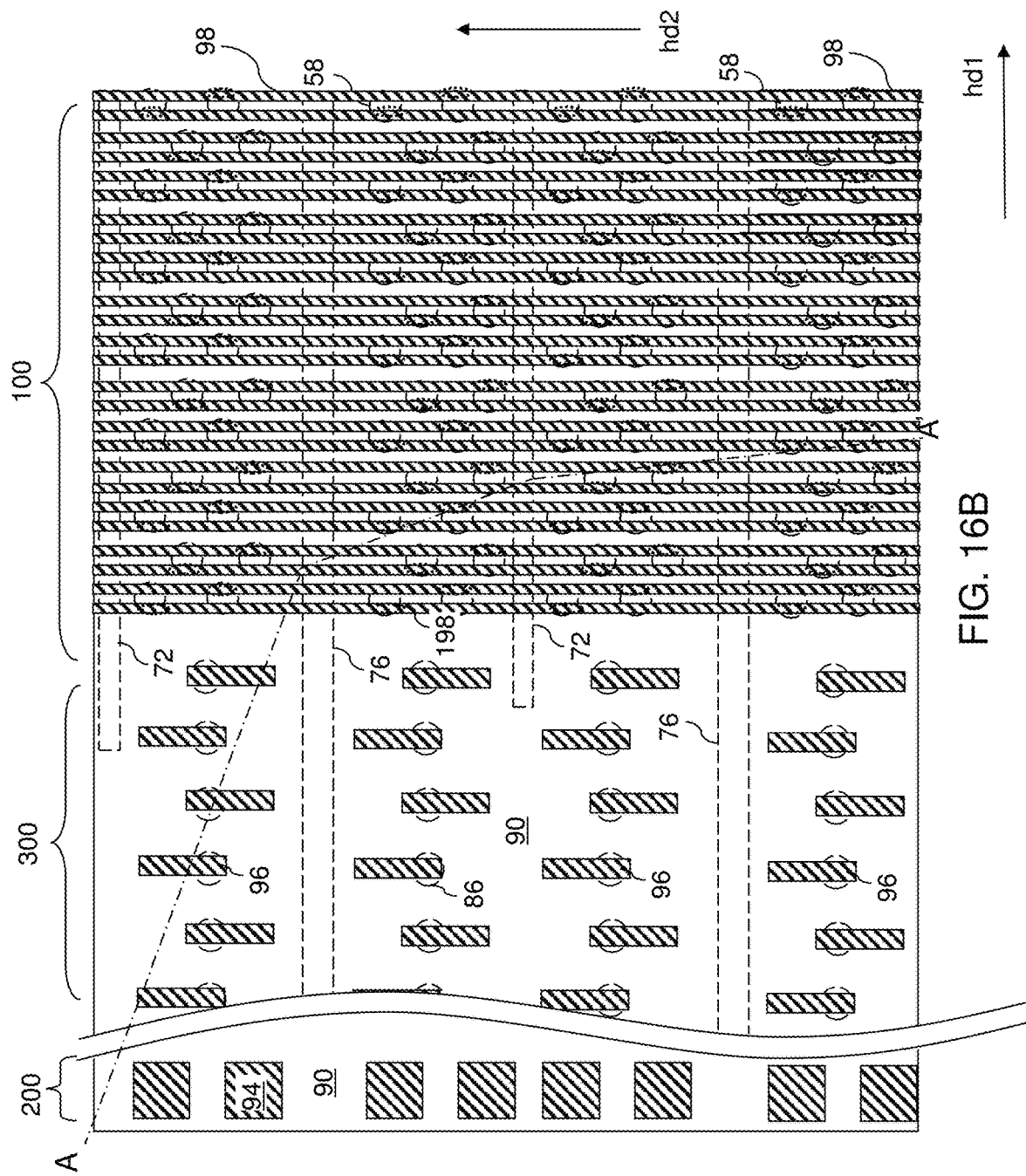
FIG. 16B is a partial see-through top-down view of the first exemplary structure of FIG. 16A. The vertical plane A-A' is the plane of the schematic vertical cross-sectional view of FIG. 16A.

Referring to FIGS. 16A and 16B, a via-level dielectric layer 80 is formed over the contact-level dielectric layer 73. Various contact via structures (198, 196, 194) can be formed through the via-level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line-level dielectric layer 90 is deposited over the via-level dielectric layer 80. Various metal line structures (98, 96, 94) are formed in the first line-level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 through the drain regions 63 in the memory array region 100. In one embodiment, the memory stack structures 55 are arranged in rows that extend along the first horizontal direction hd1, and the bit lines 98 laterally extend along the second horizontal direction hd2.

Figure 17:
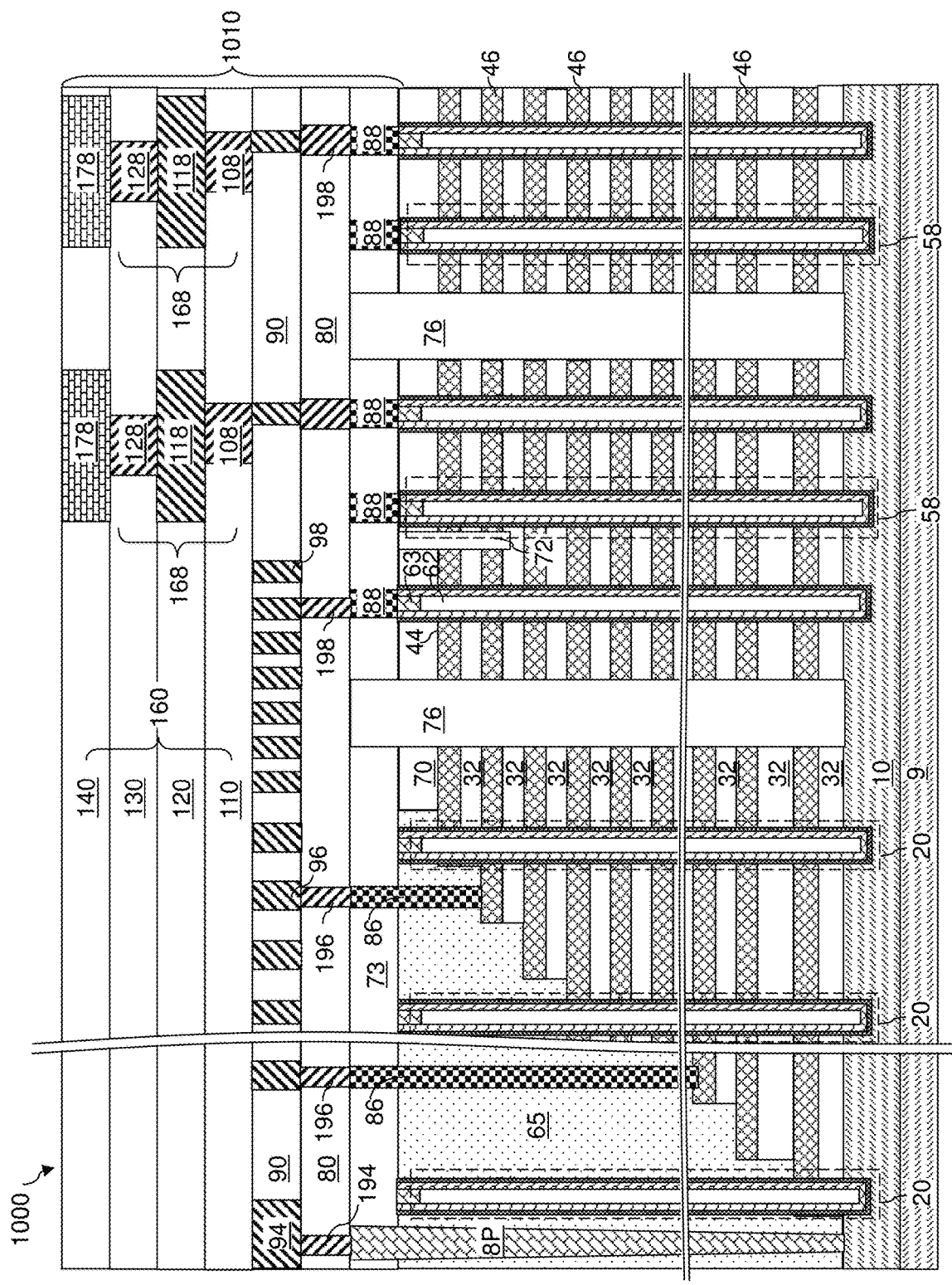
FIG. 17 is a schematic vertical cross-sectional view of the first exemplary structure after formation of additional metal interconnect structures according to an embodiment of the present disclosure.

Referring to FIG. 17, a first semiconductor die, which can be a memory die 1000, is provided by performing additional processing steps on the first exemplary structure. Specifically, additional metal interconnect structures 168 and front-side bonding structures 178 included in additional interconnect-level dielectric layers 160 are formed. In an illustrative example, the additional interconnect-level dielectric layers 160 can include a via-level dielectric layer 110, a second line-level dielectric layer 120, a second via-level dielectric layer 130, and a metallic pad structure-level dielectric layer 140. The metal interconnect structures 168 can include first metal via structures 108 included in the first via-level dielectric layer 110, second metal line structures 118 included within the second line-level dielectric layer 120, and second metal via structures 128 included in the second via-level dielectric layer 130. The front-side bonding structures 178 (such as metallic pad structures) are included in the metallic pad structure-level dielectric layer 140. While the present disclosure is described using an example in which the additional interconnect-level dielectric layers 160 include the first via-level dielectric layer 110, the second line-level dielectric layer 120, the second via-level dielectric layer 130, and the metallic pad structure-level dielectric layer 140, embodiments are expressly contemplated herein in which the additional interconnect-level dielectric layers 160 include a different number and/or different combinations of dielectric material layers. The memory die 1000 includes a three-dimensional array of memory elements. Electrical connection paths can be provided by each combination of a front-side bonding structure 178 and a set of metal interconnect structures {(194, 94, 108, 118, 128), (196, 96, 108, 118, 128), or (198, 98, 108, 118, 128)}. The combination of dielectric material layers located above the insulating cap layer 70 and the set of all metal interconnect structures and the front-side bonding structures 178 embedded within the dielectric material layers located above the insulating cap layer 70 is herein referred to as a front-side interconnect assembly 1010.

Figure 18:
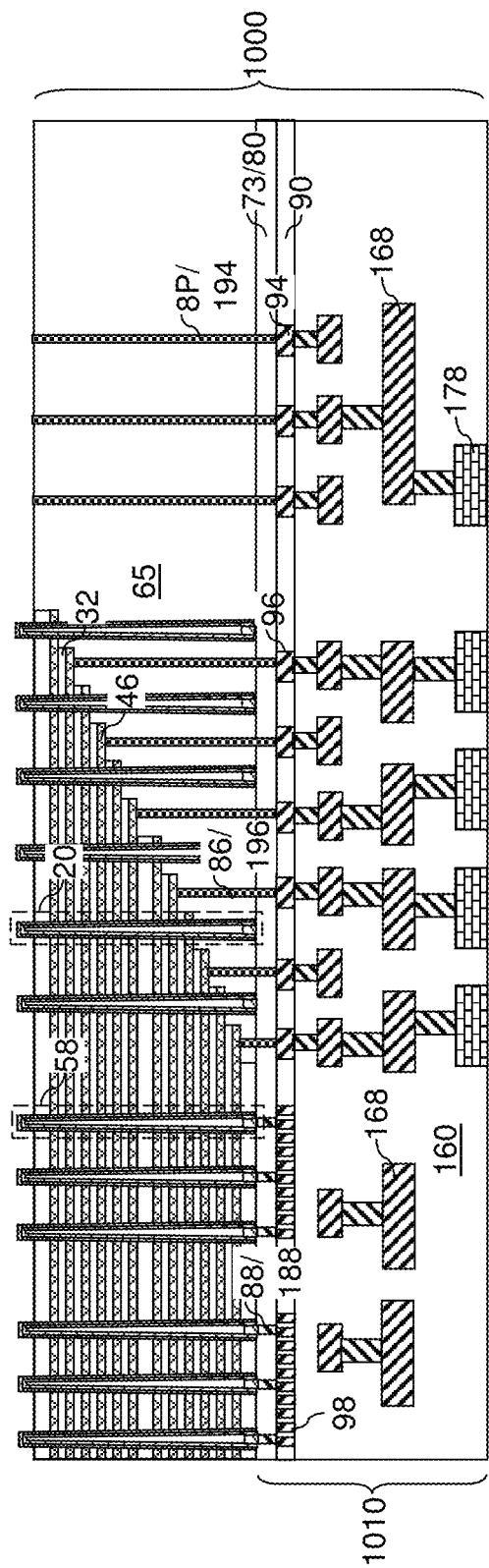
FIG. 18 is a schematic vertical cross-sectional view of the first exemplary structure after removal of the substrate layer and the semiconductor material layer according to an embodiment of the present disclosure.

Referring to FIG. 18, the substrate layer 9 can optionally be removed from the backside of the memory die 1000, for example, by grinding, polishing, cleaving, an anisotropic etch process, and/or an isotropic etch process. Subsequently, the semiconductor material layer 10 can be removed selective to the materials of the insulating layers 32 and the retro-stepped dielectric material portion, for example, by an isotropic etch process such as a wet etch process employing a KOH solution, a hot trimethyl-2 hydroxyethyl ammonium hydroxide ("hot TMY") solution, and/or a tetramethyl ammonium hydroxide (TMAH) solution. A planar surface of a most distal one of the insulating layers 32 (i.e., the bottommost insulating layer 32 formed directly on the semiconductor material layer 10 at the processing steps of FIG. 2) within the alternating stack (32, 46) is physically exposed upon removal of the semiconductor material layer 10. A planar surface of the stepped dielectric material portion 65 is physically exposed upon removal of the semiconductor material layer 10. A series of isotropic etch processes can be performed to remove portions of the memory films 50 that protrude outward from the horizontal plane including a physically exposed surface of a topmost insulating layer 32 (when the memory die 1000 is oriented such that the front-side bonding structures 178 are located at the bottom side). End surfaces of the vertical semiconductor channels 60 can be physically exposed.

Figure 19:
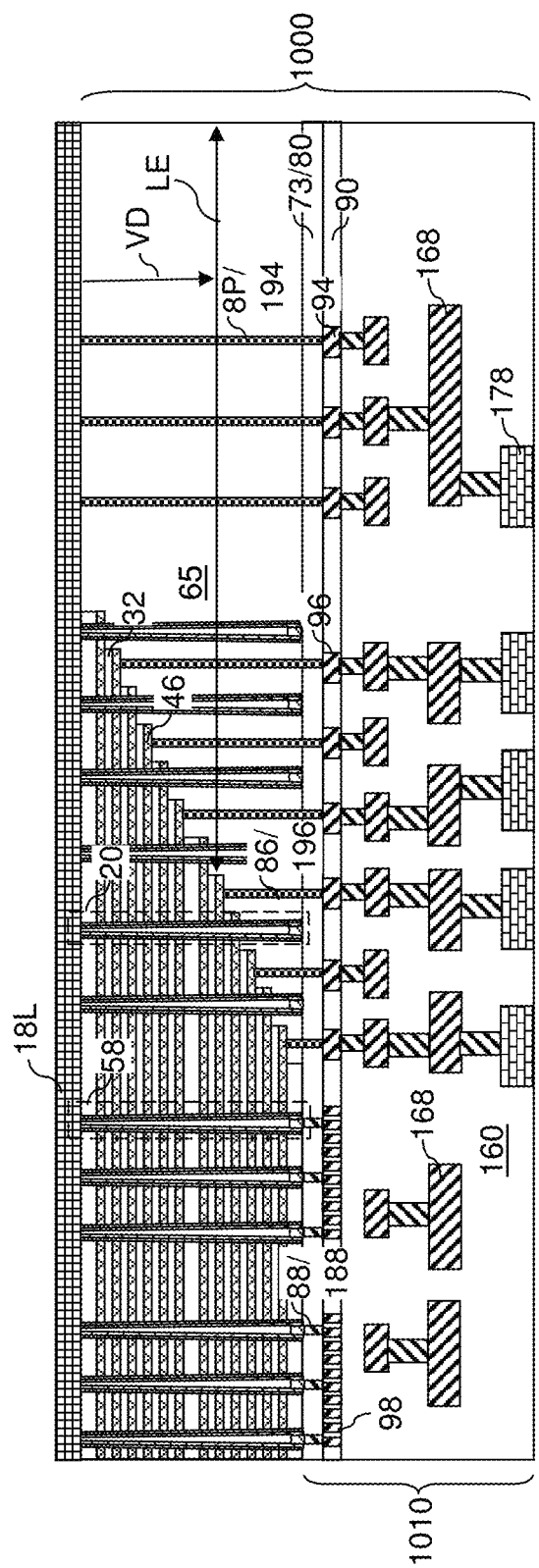
FIG. 19 is a schematic vertical cross-sectional view of the first exemplary structure after formation of the source line layer according to an embodiment of the present disclosure.

Referring to FIG. 19, an electrically conductive layer 18L, such as a metal, metal alloy or doped semiconductor material layer can be deposited directly on the physically exposed surfaces of the vertical semiconductor channels 60, the planar surface of the physically exposed one of the insulating layers 32, and on the physically exposed planar surface of the stepped dielectric material portion 65. The doped semiconductor material can include a conductive semiconductor material (i.e., a heavily doped semiconductor material) having a doping of the second conductivity type, i.e., the opposite of the first conductivity type. Thus, the doped semiconductor material can include a doped semiconductor material having a conductivity greater than $1.0 \times 10^5$ S/cm. The thickness of the electrically conductive layer 18L can be in a range from 100 nm to 1,000 nm, although lesser and greater thicknesses can also be used.

Figure 20:
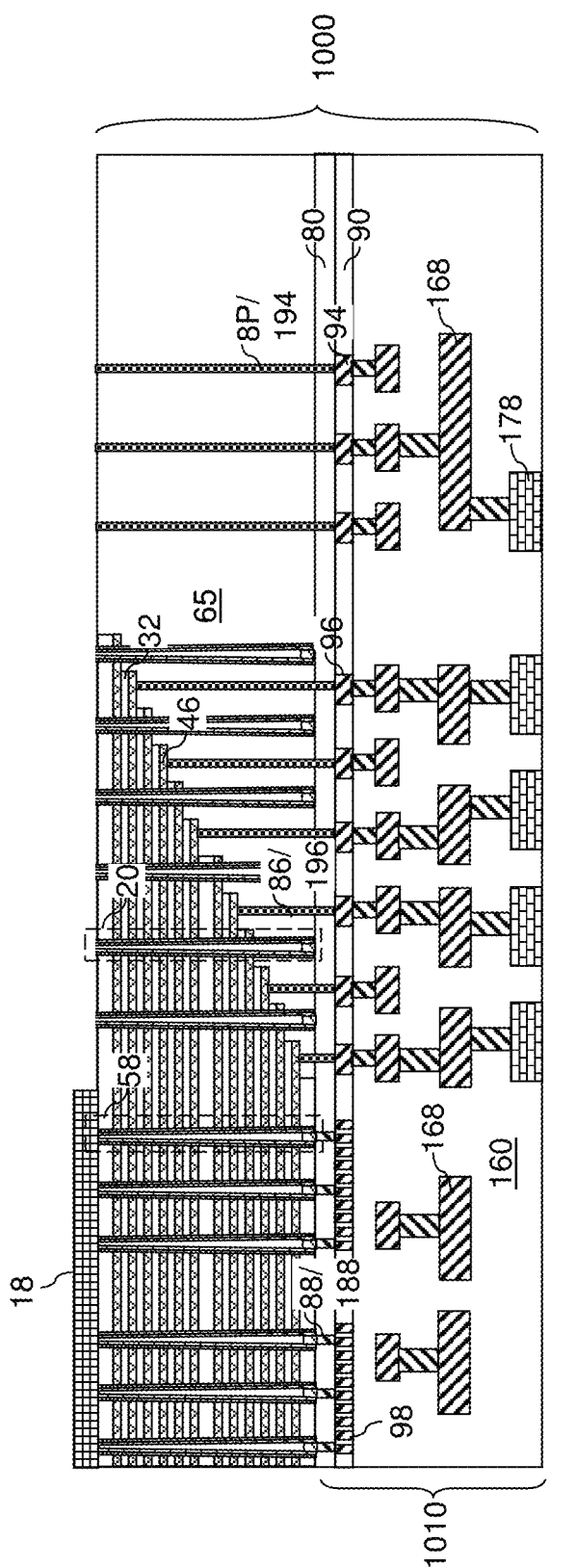
FIG. 20 is a schematic vertical cross-sectional view of the first exemplary structure after patterning the source line layer according to an embodiment of the present disclosure.

Referring to FIG. 20, the electrically conductive layer 18L can be patterned into a source line layer 18, for example, by a combination of lithographic methods and an etch process. The source line layer 18 is formed directly on the distal end of each of the vertical semiconductor channels 60 within the memory opening fill structures 58, and does not contact any of the vertical semiconductor channels 60 within the support pillar structures 20. The lateral extent of the source line layer 18 can be confined within the areas of the memory regions 100.

Figure 21:
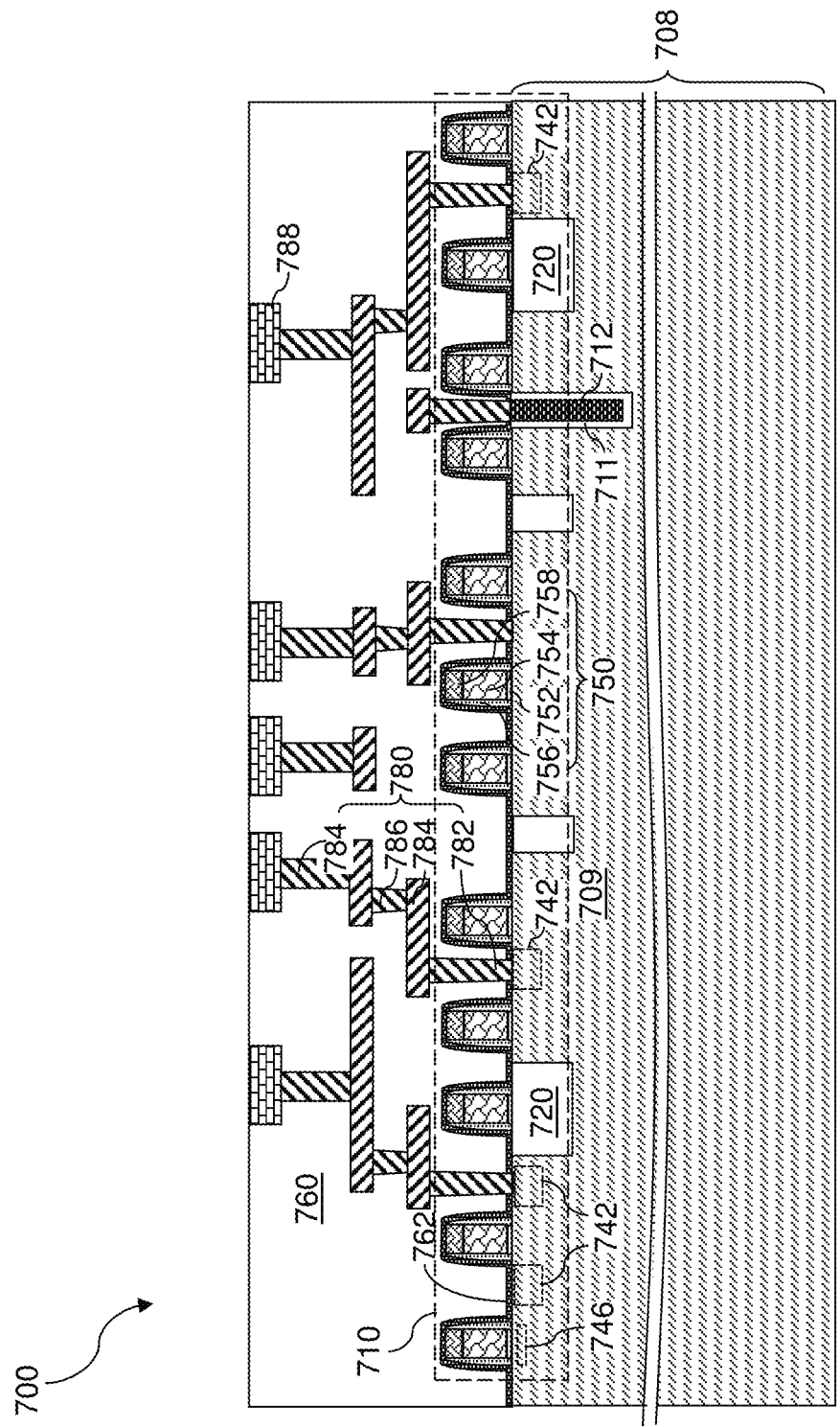
FIG. 21 is a schematic vertical cross-sectional view of a second semiconductor die according to an embodiment of the present disclosure.

Referring to FIG. 21, a second semiconductor die can be provided, which can be a logic die 700 including various semiconductor devices 710. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 55 in the memory die 1000. The logic die 700 can include a logic-die substrate 708, which can be a semiconductor substrate. The logic-die substrate can include a substrate layer 709. The substrate layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46. Laterally-insulated through-substrate via structures (711, 712) can be formed in the upper portion of the substrate layer 709.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side bonding structures 788 (such as metallic pad structures) that may be configured to function as bonding pads.

Figure 22:
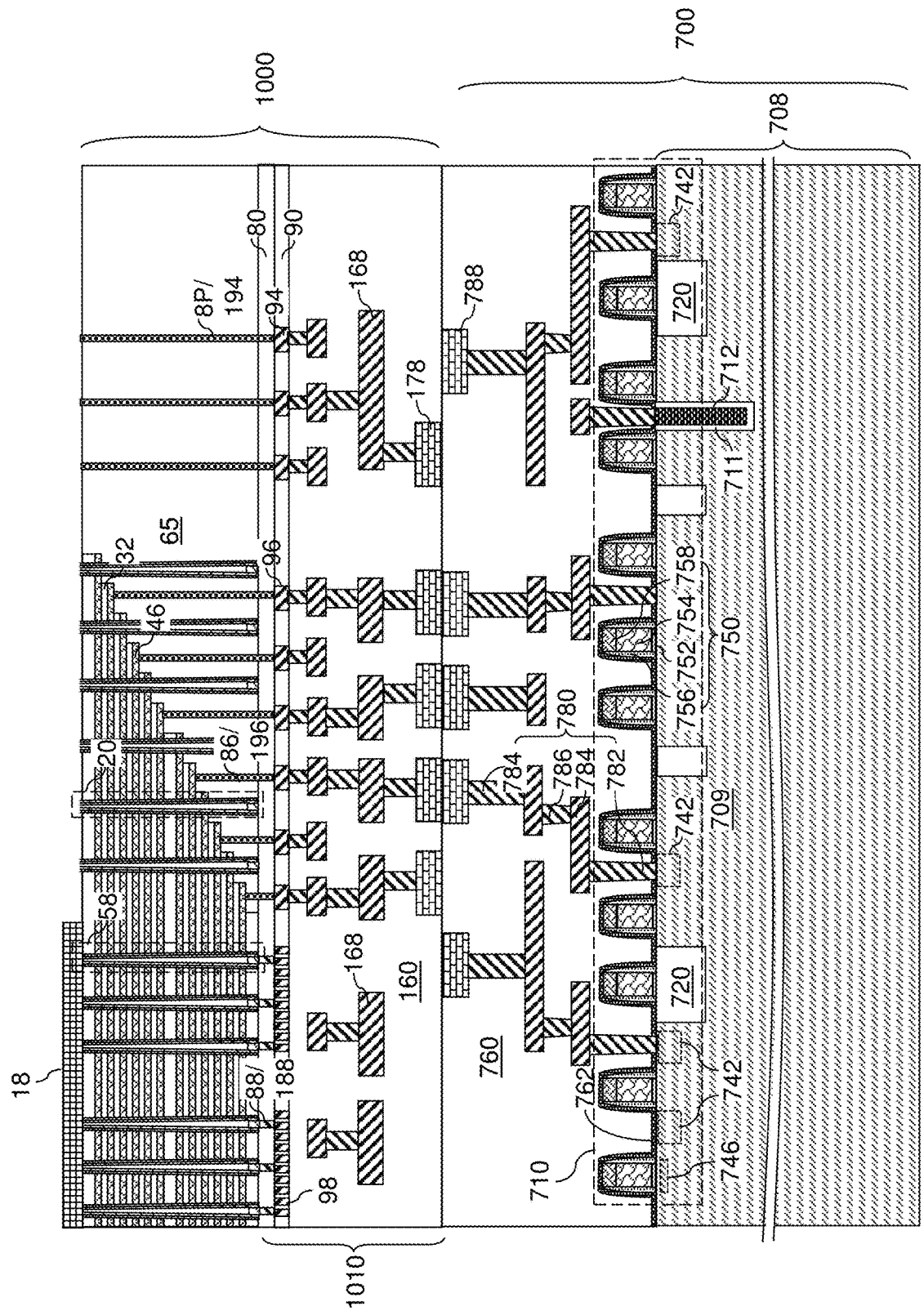
FIG. 22 is a schematic vertical cross-sectional view of a bonded assembly of the first semiconductor die and the second semiconductor die according to an embodiment of the present disclosure.

Referring to FIG. 22, the memory die 1000 and the logic die 700 are bonded to each other using metal to metal bonding or hybrid bonding. In one embodiment, the memory die 1000 and the logic die 700 can be designed such that the pattern of the logic-side bonding structures 788 of the logic die 700 is the mirror pattern of the pattern of the front-side bonding structures 178 of the memory die 1000.

Figure 23:
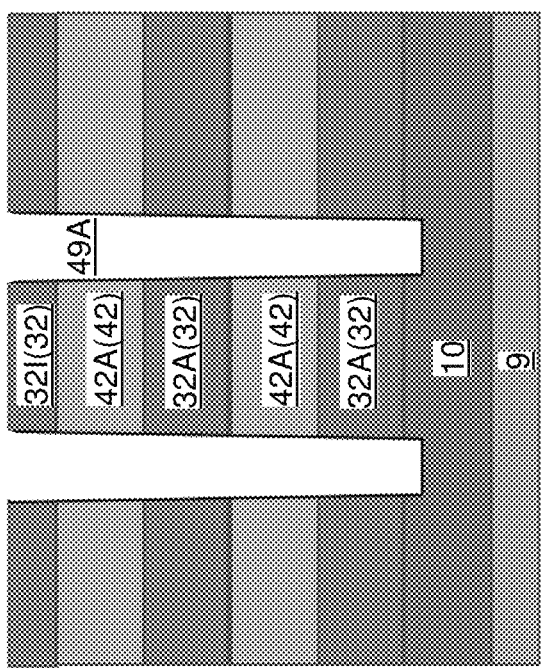
FIG. 23 is a vertical cross-sectional view of a second exemplary structure after formation of first-tier memory openings according to an embodiment of the present disclosure.

Referring to FIG. 23, a second exemplary structure according to an embodiment of the present disclosure can be derived from the first exemplary structure by employing a multi-tier structure instead of a single-tier structure. In the second exemplary structure, a first-tier alternating stack of first-tier insulating layers 32A and first-tier sacrificial material layer 42A can be formed over a semiconductor material layer 10. Each first-tier insulating layer 32A may have the same material composition as, and may have the same thickness range as, an insulating layer 32 within the first exemplary structure. Each first-tier sacrificial material layer 42A may have the same material composition as, and may have the same thickness range as, a sacrificial material layer 42 within the first exemplary structure. The first-tier insulating layers 32A are a first subset of insulating layers 32 of the second exemplary structure, and the first-tier sacrificial material layers 42A are a first subset of sacrificial material layers 42 of the second exemplary structure. First-tier memory openings 49A and first-tier support openings (not shown) can be formed through the first-tier alternating stack (32A, 42A).

Figure 24:
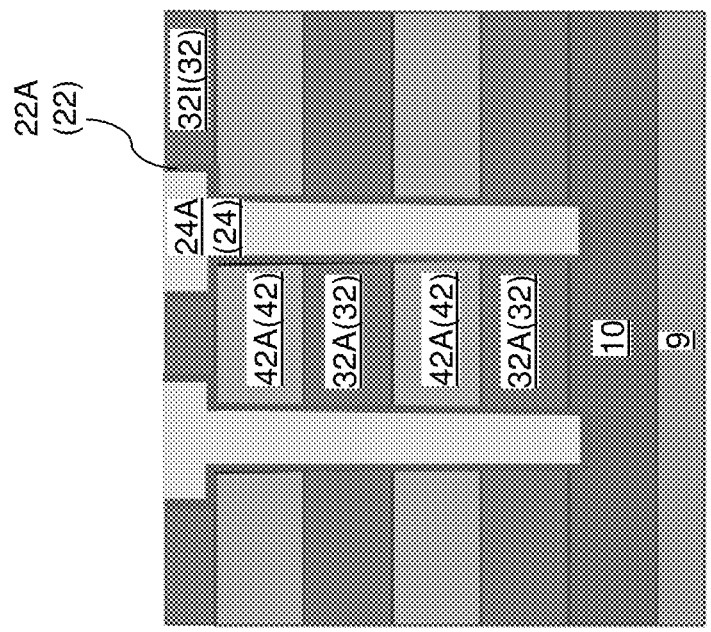
FIG. 24 is a vertical cross-sectional view of the second exemplary structure after formation of first-tier memory opening fill portions according to an embodiment of the present disclosure.

Referring to FIG. 24, a first-tier nucleation material liner 22A and a first-tier sacrificial fill material portion 24A can be formed within each of the first-tier memory openings 49A and the first-tier support openings. Each first-tier nucleation material liner 22A can include the same material as, and can have the same thickness range as, the nucleation material liners 22 employed in the first exemplary structure. Each first-tier sacrificial fill material portion 24A can include the same material as the sacrificial fill material portions 24 in the first exemplary structure. The first-tier nucleation material liners 22A are a first subset of nucleation material liners 22 employed in the second exemplary structure. The first-tier sacrificial fill material portions 24A are a first subset of sacrificial fill material portions 24 employed in the second exemplary structure.

Figure 25:
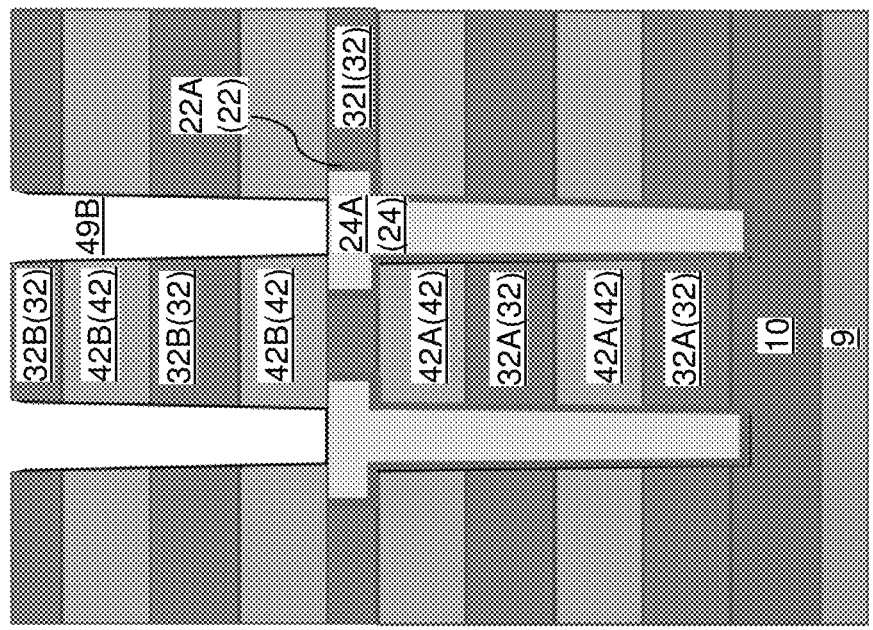
FIG. 25 is a vertical cross-sectional view of the second exemplary structure after formation of a second-tier alternating stack according to an embodiment of the present disclosure.

Referring to FIG. 25, a second-tier alternating stack of second-tier insulating layers 32B and second-tier sacrificial material layer 42B can be formed over the first-tier alternating stack (32A, 42A). Each second-tier insulating layer 32B may have the same material composition as, and may have the same thickness range as, an insulating layer 32 within the first exemplary structure. Each second-tier sacrificial material layer 42B may have the same material composition as, and may have the same thickness range as, a sacrificial material layer 42 within the first exemplary structure. The second-tier insulating layers 32B are a second subset of insulating layers 32 of the second exemplary structure, and the second-tier sacrificial material layers 42B are a second subset of sacrificial material layers 42 of the second exemplary structure.

Figure 26:
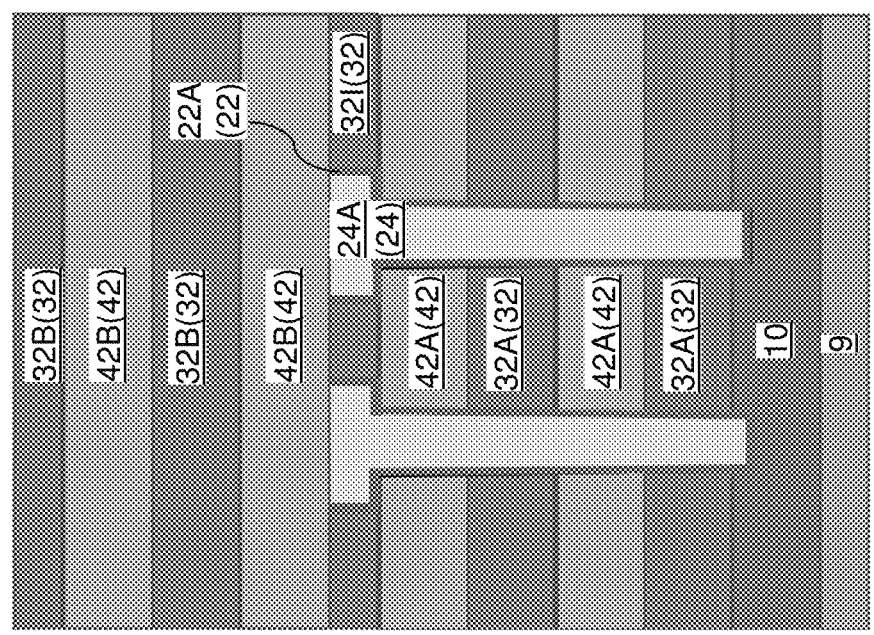
FIG. 26 is a vertical cross-sectional view of the second exemplary structure after formation of second-tier memory openings according to an embodiment of the present disclosure.

Referring to FIG. 26, second-tier memory openings 49B and second-tier support openings (not shown) can be formed through the second-tier alternating stack (32B, 42B). Each second-tier memory opening 49B can be formed over a respective one of the sacrificial fill material portions 24 in the first-tier memory openings 49A. Each second-tier support openings can be formed over a respective one of the sacrificial fill material portions 24 in the first-tier support openings.

Figure 27:
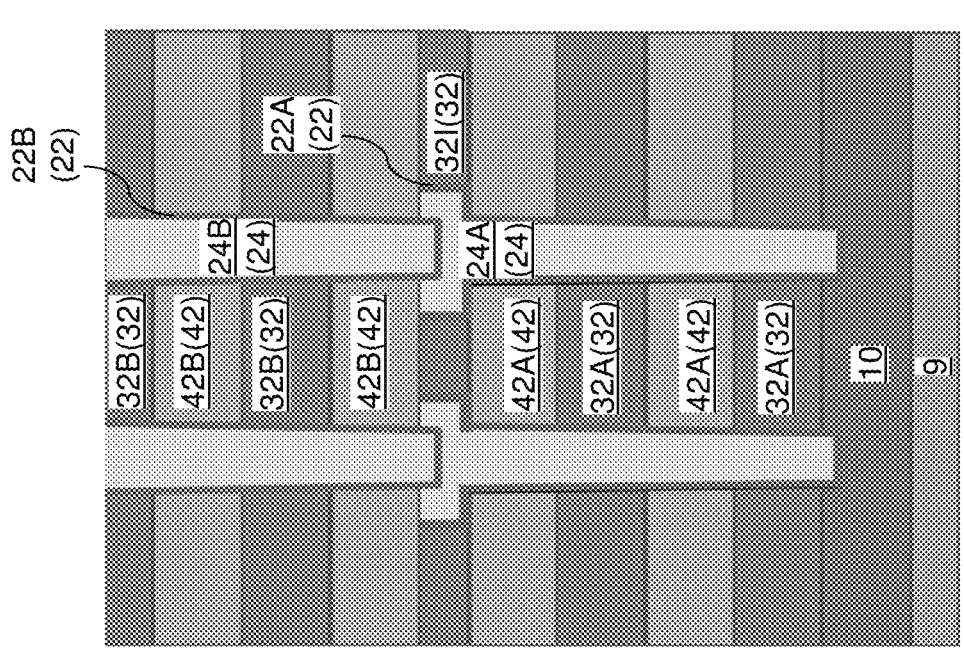
FIG. 27 is a vertical cross-sectional view of the second exemplary structure after formation of second-tier memory opening fill portions according to an embodiment of the present disclosure.

Referring to FIG. 27, a second-tier nucleation material liner 22B and a second-tier sacrificial fill material portion 24B can be formed within each of the second-tier memory openings 49B and the second-tier support openings. Each second-tier nucleation material liner 22B can include the same material as, and can have the same thickness range as, the nucleation material liners 22 employed in the first exemplary structure. Each second-tier sacrificial fill material portion 24B can include the same material as the sacrificial fill material portions 24 in the first exemplary structure. The second-tier nucleation material liners 22B are a second subset of nucleation material liners 22 employed in the second exemplary structure. The second-tier sacrificial fill material portions 24B are a second subset of sacrificial fill material portions 24 employed in the second exemplary structure.

Figure 28:
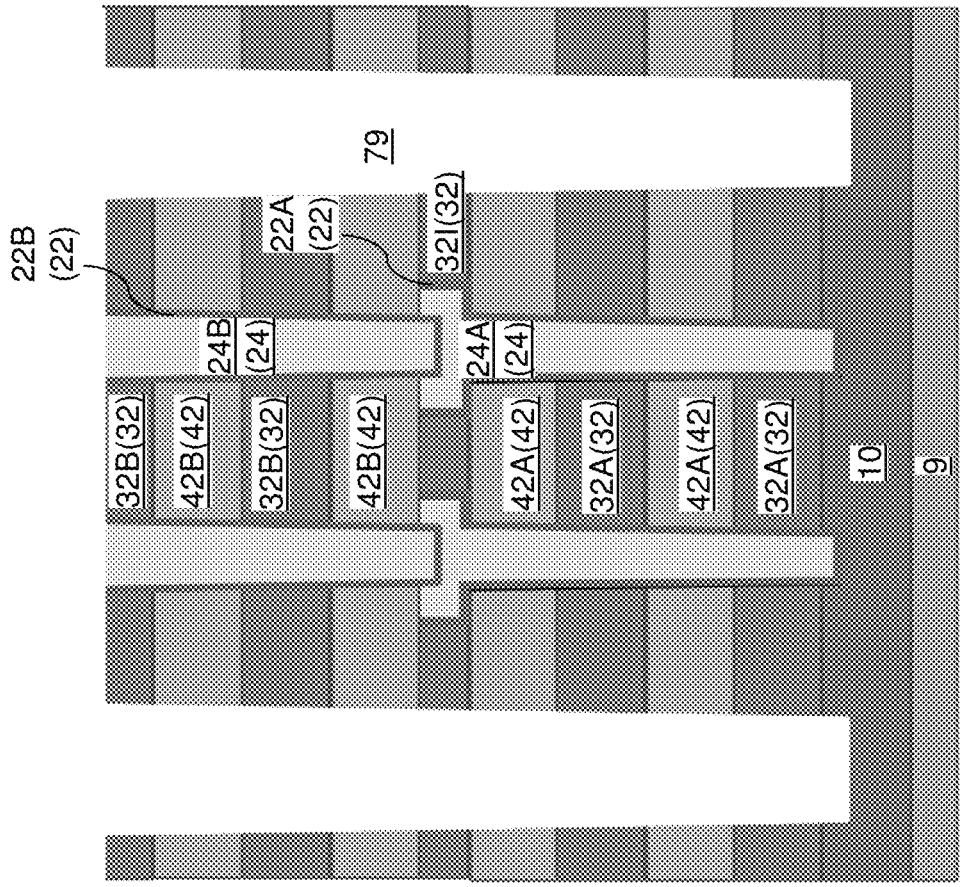
FIG. 28 is a vertical cross-sectional view of the second exemplary structure after formation of backside trenches according to an embodiment of the present disclosure.

Referring to FIG. 28, backside trenches 79 can be formed through the second-tier alternating stack (32B, 42B) and the first-tier alternating stack (32A, 42A) by performing the processing steps of FIGS. 6A and 6B.

Figure 29:
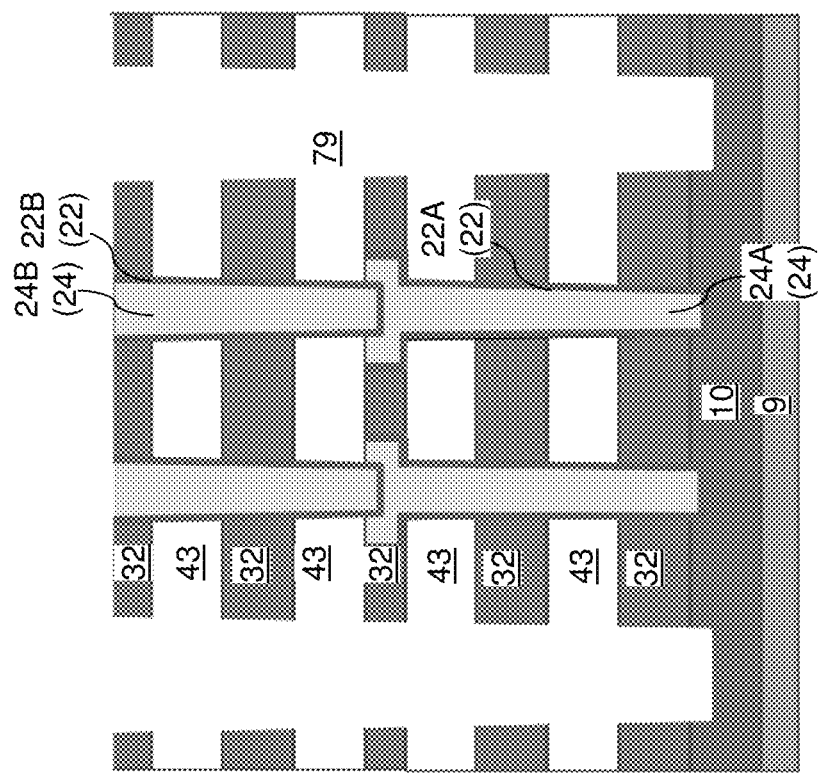
FIG. 29 is a vertical cross-sectional view of the second exemplary structure after formation of backside recesses according to an embodiment of the present disclosure.

Referring to FIG. 29, the processing steps of FIG. 7 can be performed to form backside recesses 43 by removing the first-tier sacrificial material layers 42A and the second-tier sacrificial material layers 42B selective to the insulating layers 32.

Figure 30:
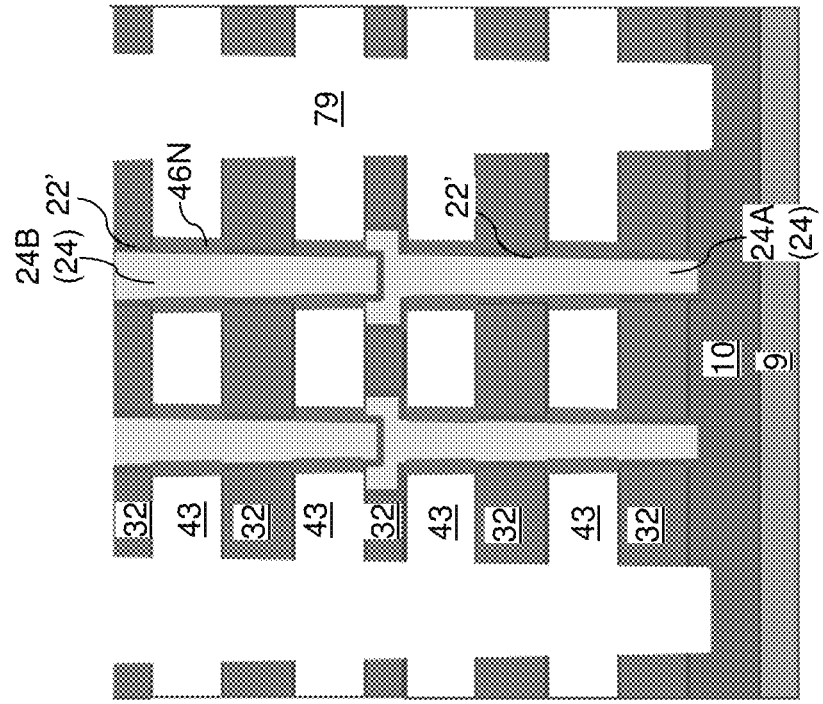
FIG. 30 is a vertical cross-sectional view of the second exemplary structure after formation of tubular metallic liners according to an embodiment of the present disclosure.

Referring to FIG. 30, the processing steps of FIG. 8 can be performed to form tubular metallic liners 46N by introducing a first metal-containing precursor gas into the backside recesses 43.

Figure 31:
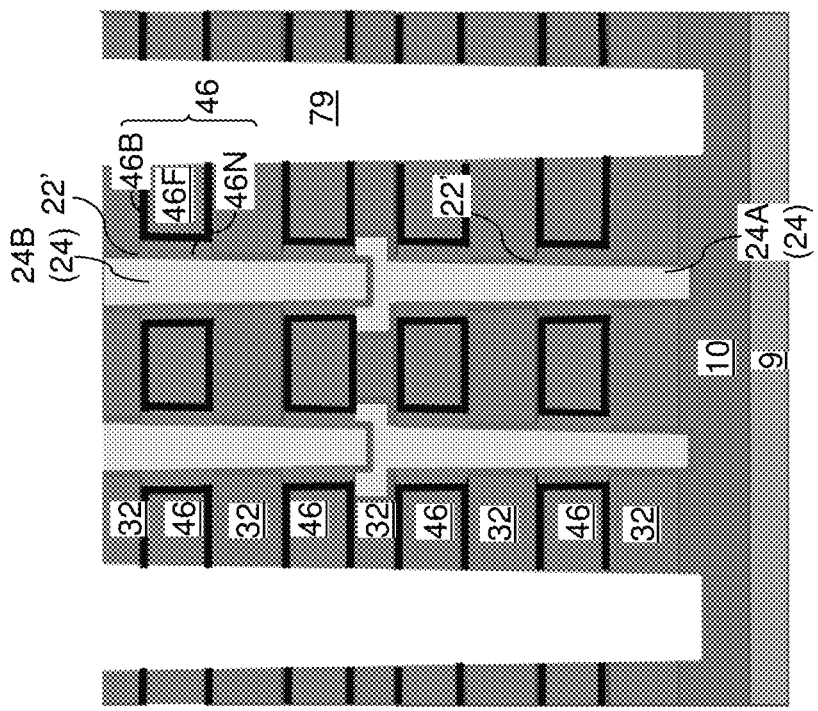
FIG. 31 is a vertical cross-sectional view of the second exemplary structure after formation of metallic fill material layers according to an embodiment of the present disclosure.

Referring to FIG. 31, the processing steps of FIG. 9 can be performed to form the electrically conductive barrier layers 46B and the metallic fill material layers 46F in the backside recesses 43.

Figure 32:
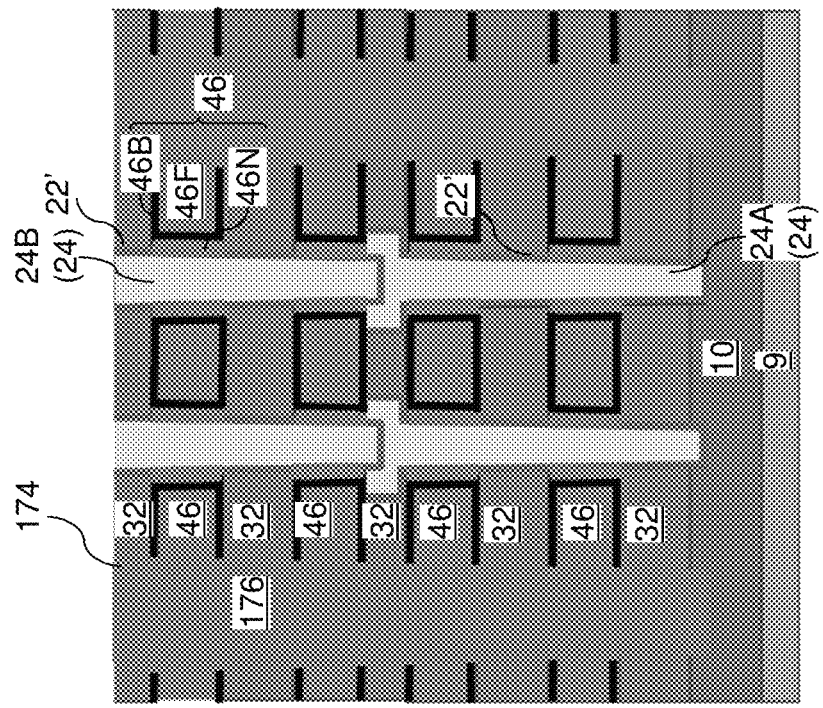
FIG. 32 is a vertical cross-sectional view of the second exemplary structure after formation of backside trench fill structures according to an embodiment of the present disclosure.

Referring to FIG. 32, an insulating spacer 174 and a backside contact via structure 176 (e.g., local interconnect) including a conductive material (such as a metal or heavily doped polysilicon) can be formed within each of the backside trenches 79. The insulating spacers 174 can be formed by conformally depositing and anisotropically etching an insulating material layer. The backside contact via structures 176 can be formed by depositing at least one conductive material in remaining volumes of the backside trenches 79.

Figure 33:
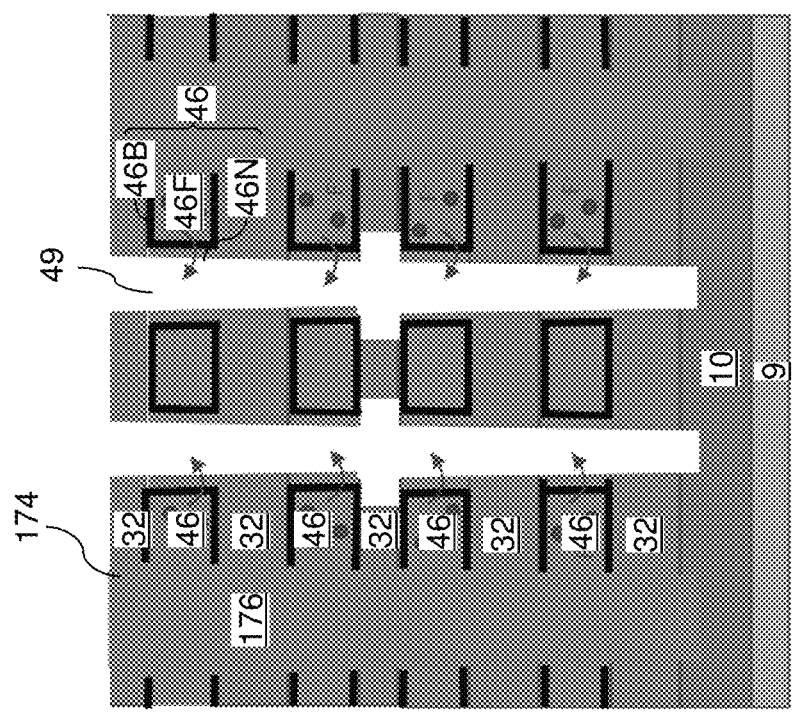
FIG. 33 is a vertical cross-sectional view of the second exemplary structure after removal of sacrificial memory opening fill structures according to an embodiment of the present disclosure.

Referring to FIG. 33, the processing steps of FIG. 11 can be performed to remove remaining portions of the sacrificial memory opening fill structures and the sacrificial support opening fill structures, each of which comprises a respective set of a second-tier sacrificial fill material portion 24B, a first-tier sacrificial fill material portion 24A, and annular portions 22' of a second-tier nucleation material liner 22B and a first-tier nucleation material liner 22A. According to an aspect of the present disclosure, a thermal anneal process described above with reference to FIG. 12 can be performed at an elevated temperature to degas volatile halogen, such as fluorine, trapped in the metallic fill material layers 46F, through the unfilled memory openings 49.

Figure 34:
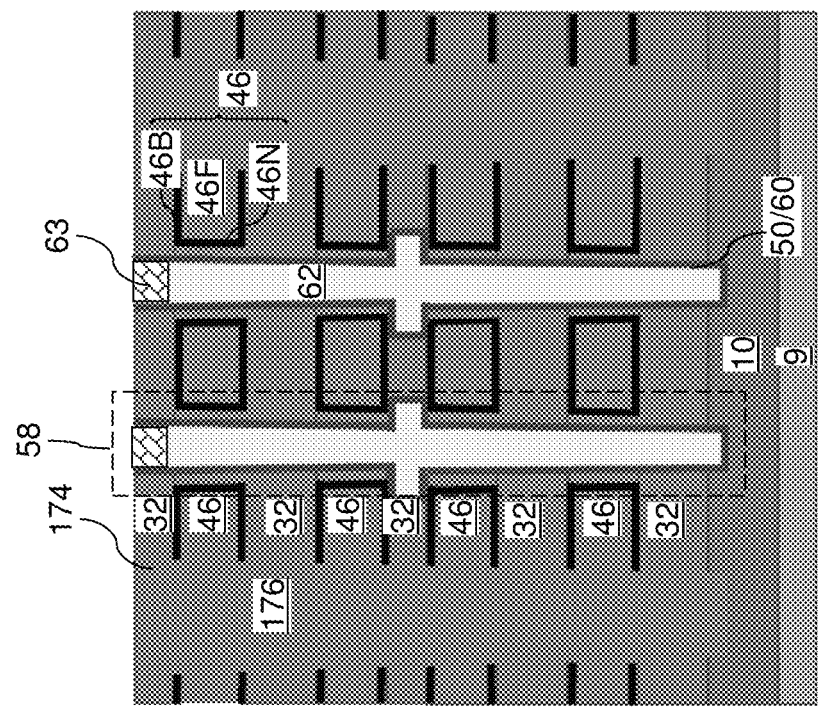
FIG. 34 is a vertical cross-sectional view of the second exemplary structure after formation of memory opening fill structures.

Referring to FIG. 34, the processing steps of FIGS. 13A and 13B can be performed to form a memory opening fill structure 58 within each memory opening and to form a support pillar structure (not shown) within each support opening.

Referring to all drawings and according to various embodiments of the present disclosure, a three-dimensional memory device includes an alternating stack of insulating layers 32 and electrically conductive layers 46, memory openings 49 extending through the alternating stack, and memory opening fill structures 58 located in the memory openings and containing a respective vertical semiconductor channel 60 and a respective memory film 50. Each of the electrically conductive layers 46 includes a tubular metallic liner 46N in contact with a respective outer sidewall segment of a respective one of the memory opening fill structures 58, an electrically conductive barrier layer 46B contacting the respective tubular metallic liner 46N and two of the insulating layers 32, and a metallic fill material layer 46F contacting the electrically conductive barrier layer 46B, and not contacting the tubular metallic liner 46N or any of the insulating layers 32.

In one embodiment, the tubular metallic liner 46N comprises tungsten doped with silicon, and the metallic fill material layer 46F comprises tungsten that contains no silicon or has a lower concentration of silicon than the tubular metallic liner. An average atomic percentage of silicon within the tubular metallic liner 46N may be in a range from 0.1% to 5.0%. In another embodiment, the tubular metallic liner 46N comprises tungsten doped with boron, and the metallic fill material layer 46F comprises tungsten that contains no boron or has a lower concentration of boron than the tubular metallic liner. An average atomic percentage of boron within the tubular metallic liner 46N may be in range from 0.1% to 5.0%.

In another embodiment, the tubular metallic liner 46N comprises a transition metal silicide, and the metallic fill material layer 46F consists essentially of a transition metal. The tubular metallic liner 46N may comprise cobalt silicide, molybdenum silicide or ruthenium silicide, and the metallic fill material layer may consist essentially of tungsten and unavoidable impurities. In one embodiment, the metallic fill material layer 46F comprises a laterally-extending seam 46S.

In one embodiment, the electrically conductive barrier layer 46B comprises titanium nitride, tungsten nitride, tungsten carbonitride or tungsten boronitride. In one embodiment, the electrically conductive barrier layer 46B has a clam shape having two horizontal portions connected to at least one vertical portion, and the metallic fill material layer 46F is surrounded on at least three sides (e.g., on top, bottom and at least one sidewall, such as on plural sidewalls) by the electrically conductive barrier layer 46B.

In one embodiment, the tubular metallic liners 46N comprise a cylindrical outer sidewall having a closed upper edge and a closed lower edge, and an inner sidewall including a straight inner sidewall segment, an upper tilted convex surface segment connecting an upper edge of the straight inner sidewall segment to the closed upper edge of the cylindrical outer sidewall, and a lower tilted convex surface segment connecting a lower edge of the straight inner sidewall segment to the closed lower edge of the cylindrical outer sidewall. The tubular metallic liner 46N may have a greater vertical extent than the metallic fill material layer 46F. In one embodiment, each of the memory films 50 comprises a respective aluminum oxide blocking dielectric layer 52 and a respective memory material layer 54. The respective aluminum oxide blocking dielectric layer 52 and the respective memory material layer 54 may have a lesser maximum lateral extent at a level of one of the electrically conductive layers 46 than at a level of an insulating layer 32 contacting a top surface of the one of the electrically conductive layers 46, and than at a level of another insulating layer 32 contacting a bottom surface of the one of the electrically conductive layers 46.

The various embodiments of the present disclosure provide electrically conductive layers 46 that have improved filling of the backside recesses 43 by forming self-aligned tubular metallic liners 46N that are nucleated employing the nucleation material liners 22 within sacrificial memory opening fill structures 26. Thus, the resistivity of the electrically conductive layers 46 can be reduced. Furthermore, by forming the memory opening fill structures 58 after performing a halogen (e.g., fluorine) outgassing anneal through the memory openings 49, the halogen outgassing damage (e.g., void formation) is reduced or eliminated in the layers of the memory film 50 (e.g., to the blocking dielectric layer 52).

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A three-dimensional memory device, comprising:
an alternating stack of insulating layers and electrically conductive layers;
memory openings extending through the alternating stack; and
memory opening fill structures located in the memory openings and comprising a respective vertical semiconductor channel and a respective memory film,
wherein each of the electrically conductive layers comprises:
 a tubular metallic liner in contact with a respective outer sidewall segment of a respective one of the memory opening fill structures;
 an electrically conductive barrier layer contacting the respective tubular metallic liner and two of the insulating layers; and
 a metallic fill material layer contacting the electrically conductive barrier layer, and not contacting the tubular metallic liner or any of the insulating layers;
wherein the tubular metallic liner comprises tungsten doped with silicon, and the metallic fill material layer comprises tungsten that contains no silicon or has a lower concentration of silicon than the tubular metallic liner; and
wherein an average atomic percentage of silicon within the tubular metallic liner is in a range from 0.1% to 5.0%.

2. A three-dimensional memory device, comprising:
an alternating stack of insulating layers and electrically conductive layers;
memory openings extending through the alternating stack; and
memory opening fill structures located in the memory openings and comprising a respective vertical semiconductor channel and a respective memory film,
wherein each of the electrically conductive layers comprises:
 a tubular metallic liner in contact with a respective outer sidewall segment of a respective one of the memory opening fill structures;
 an electrically conductive barrier layer contacting the respective tubular metallic liner and two of the insulating layers; and
 a metallic fill material layer contacting the electrically conductive barrier layer, and not contacting the tubular metallic liner or any of the insulating layers;
wherein the tubular metallic liner comprises tungsten doped with boron, and the metallic fill material layer comprises tungsten that contains no boron or has a lower concentration of boron than the tubular metallic liner; and
wherein an average atomic percentage of boron within the tubular metallic liner is in a range from 0.1% to 5.0%.

3. A three-dimensional memory device, comprising:
an alternating stack of insulating layers and electrically conductive layers;
memory openings extending through the alternating stack; and
memory opening fill structures located in the memory openings and comprising a respective vertical semiconductor channel and a respective memory film,
wherein each of the electrically conductive layers comprises:
 a tubular metallic liner in contact with a respective outer sidewall segment of a respective one of the memory opening fill structures;
 an electrically conductive barrier layer contacting the respective tubular metallic liner and two of the insulating layers; and
 a metallic fill material layer contacting the electrically conductive barrier layer, and not contacting the tubular metallic liner or any of the insulating layers;
wherein the tubular metallic liners comprise:
 a cylindrical outer sidewall having a closed upper edge and a closed lower edge; and
 an inner sidewall including a straight inner sidewall segment, an upper tilted convex surface segment connecting an upper edge of the straight inner sidewall segment to the closed upper edge of the cylindrical outer sidewall, and a lower tilted convex surface segment connecting a lower edge of the straight inner sidewall segment to the closed lower edge of the cylindrical outer sidewalk;
wherein the tubular metallic liner has a greater vertical extent than the metallic fill material layer; and
wherein:
each of the memory films comprises a respective aluminum oxide blocking dielectric layer and a respective memory material layer; and
the respective aluminum oxide blocking dielectric layer and the respective memory material layer have a lesser maximum lateral extent at a level of one of the electrically conductive layers than at a level of an insulating layer contacting a top surface of the one of the electrically conductive layers and than at a level of another insulating layer contacting a bottom surface of the one of the electrically conductive layers.

4. A three-dimensional memory device, comprising:
an alternating stack of insulating layers and electrically conductive layers;
memory openings extending through the alternating stack; and
memory opening fill structures located in the memory openings and comprising a respective vertical semiconductor channel and a respective memory film,
wherein each of the electrically conductive layers comprises:
 a tubular metallic liner in contact with a respective outer sidewall segment of a respective one of the memory opening fill structures;
 an electrically conductive barrier layer contacting the respective tubular metallic liner and two of the insulating layers; and a metallic fill material layer contacting the electrically conductive barrier layer, and not contacting the tubular metallic liner or any of the insulating layers; and wherein each of the memory opening fill structures comprises a respective vertical stack of nucleation material liners that contact a respective one of the insulating layers.

5. The three-dimensional memory device of claim 4, wherein the respective vertical stack of nucleation material liners is vertically interlaced with a respective vertical stack of tubular metallic liners that is a respective subset of the tubular metallic liners within the electrically conductive layers.

6. The three-dimensional memory device of claim 4, wherein the nucleation material liners comprise a semiconductor material, boron, boron nitride, or a boron-silicon alloy.

* * * * *